United States Patent [19]
Bennin et al.

[11] Patent Number: 5,864,445
[45] Date of Patent: *Jan. 26, 1999

[54] HYGROTHERMAL LOAD COMPENSATING STRUCTURES IN AN INTEGRATED LEAD SUSPENSION

[75] Inventors: Jeffry S. Bennin, Hutchinson; Todd W. Boucher, Stewart; James H. Dettmann, Duluth; Lloyd C. Goss, Bloomington; Gary E. Gustafson, Darwin; Michael T. Hofflander, Edina; Brent D. Lien, Minneapolis; Dean E. Myers, Stewart, all of Minn.

[73] Assignee: Hutchinson Technology Incorporated, Hutchinson, Minn.

[*] Notice: The term of this patent shall not extend beyond the expiration date of Pat. No. 5,491,597.

[21] Appl. No.: 770,541

[22] Filed: Dec. 20, 1996

Related U.S. Application Data

[63] Continuation of Ser. No. 249,117, May 25, 1994, which is a continuation-in-part of Ser. No. 227,960, Apr. 15, 1994, Pat. No. 5,491,597, and a continuation-in-part of Ser. No. 227,978, Apr. 15, 1994.

[51] Int. Cl.$^6$ .............................. G11B 5/50; G11B 21/18
[52] U.S. Cl. .......................... 360/104; 360/105; 360/108; 369/126
[58] Field of Search .................................... 360/104, 103, 360/108; 369/126

[56] References Cited

U.S. PATENT DOCUMENTS

| | | | |
|---|---|---|---|
| 4,543,295 | 9/1985 | Clair et al. | 428/458 |
| 4,616,279 | 10/1986 | Poorman | 360/103 |
| 4,789,914 | 12/1988 | Ainslie et al. | 360/103 |
| 4,996,623 | 2/1991 | Erpelding et al. | 360/104 |
| 5,103,359 | 4/1992 | Marazzo | 360/104 |
| 5,331,489 | 7/1994 | Johnson et al. | 360/104 |
| 5,391,842 | 2/1995 | Bennin et al. | 174/260 |
| 5,422,764 | 6/1995 | McIlvanie | 360/97.01 |
| 5,490,027 | 2/1996 | Hamilton et al. | 360/104 |
| 5,491,597 | 2/1996 | Bennin et al. | 360/104 |
| 5,594,607 | 1/1997 | Erpelding et al. | 360/104 |
| 5,598,307 | 1/1997 | Bennin | 360/104 |
| 5,606,477 | 2/1997 | Erpelding et al. | 360/104 |
| 5,631,786 | 5/1997 | Erpelding | 360/97.01 |
| 5,645,735 | 7/1997 | Benin et al. | 216/22 |
| 5,666,717 | 9/1997 | Matsumoto et al. | 360/104 X |

FOREIGN PATENT DOCUMENTS

| | | |
|---|---|---|
| 0 599 669 | 6/1994 | European Pat. Off. . |
| 53-19015 | 2/1978 | Japan . |
| 53-30310 | 3/1978 | Japan . |
| 60-246015 | 12/1985 | Japan . |
| 4-146516 | 5/1992 | Japan . |
| WO 95-13609 | 5/1995 | WIPO . |

*Primary Examiner*—John H. Wolff
*Attorney, Agent, or Firm*—Faegre & Benson LLP

[57] ABSTRACT

An integrated lead disk drive suspension including a load beam and one or more conductive leads. The load beam has a mounting region on a proximal end, a head bonding platform on a distal end, and one or more spring regions connecting the head bonding platform to the mounting region. The conductive leads are integrated with and insulated from the load beam by an adhesive dielectric layer, and extend between the head bonding platform and the mounting region. The leads are adapted to reduce mechanical effects of the leads and/or dielectric layer on spring characteristics of the spring regions. One embodiment of the leads includes at least a first compensating portion which extends off the load beam and traverses a nonlinear path around at least a portion of one or more of the spring regions. In another embodiment the portions of the conductive leads extending between the distal end of the load beam and the head bonding platform are substantially free from the dielectric layer. In yet another embodiment the width of portions of the dielectric layer is about equal to or less than the width of adjacent portions of the conductive leads.

9 Claims, 25 Drawing Sheets

HYGROTHERMAL LOAD COMPENSATING STRUCTURES IN AN INTEGRATED LEAD SUSPENSION

This is a continuation of U.S. patent application Ser. No. 08/249,117, filed May 25, 1994, entitled "LAMINATED STRUCTURES FOR A DISK DRIVE SUSPENSION ASSEMBLY", which is a continuation-in-part of U.S. Pat. No. 5,491,597 issued on Feb. 13, 1996 and entitled "GIMBAL FLEXURE AND ELECTRICAL INTERCONNECT ASSEMBLY" and a continuation-in-part of commonly assigned U.S. patent application Ser. No. 08/227,978 filed Apr. 15, 1994 and entitled "ELECTRICAL TRACE INTERCONNECT ASSEMBLY" now abandoned and refiled as a file wrapper continuation, Ser. No. 08/674,342, entitled "MAGNETIC HEAD SUSPENSION WITH SINGLE LAYER PRE-SHAPED TRACE INTERCONNECT".

BACKGROUND OF THE INVENTION

Suspension assemblies are spring structures in disk drives that position a read/write head assembly nanometers away from the rapidly spinning surface of a rotatable disk or other data storage device. The suspension assembly presses the head toward the disk surface with a precise force applied in a precisely determined location. The head assembly "flies" over the irregular (at this scale) surface of the disk at a height established by the equilibrium of the suspension assembly downward force and the increasing lift force of the air stream generated by the spinning disk as the head nears the disk.

A head suspension assembly (HSA) includes the suspension assembly, the head assembly, and an interconnect assembly. The interconnect assembly is a collection of transmission elements designed to transmit data to and from the head assembly. HSAs are used in magnetic hard disk drives, the most common today, or other type of drives such as optical disk drives.

The suspension assembly includes two spring structures, a load beam and a gimbal, each a carefully balanced combination of rigid regions and flexible spring regions. The load beam is a resilient spring plate designed to provide lateral stiffness and calibrated to apply the necessary load on the head assembly. The gimbal is a spring positioned at the distal end of the suspension assembly and of the load beam. The gimbal holds the head assembly at an appropriate orientation (flying attitude) and at a constant distance over the contours of the disk, even if the load beam flexes and twists. The head assembly is attached to the gimbal and includes a "head," a highly sensitive read/write transducer, attached to an air bearing slider. The head assembly also includes electrical terminals configured for interconnection to the interconnect assembly for receiving and relaying data (read and write signals).

A magnetic write transducer transforms electrical write signals into small magnetic fields. The magnetic field magnetize patterns on a magnetic disk. The order of the magnetic fields and their subsequent orientation defines a bit code representing the stored data. A magnetic read transducer "reads" these magnetic fields as it flies over them and converts them back into electrical signals.

The suspension assembly can be attached at its proximal end to a rigid arm or directly to a linear or rotary motion actuator. The actuator rapidly moves (and then abruptly stops) the HSA over any position on a radius of the disk. The radial HSA movement and the rotation of the disk allow the head to quickly reach every location above the disc. The rapid stop and go movement causes very high stresses on the HSA.

The closer the head assembly can fly to the surface of a magnetic disk, the more densely information can be stored (the strength of a magnetic field varies proportionally to the square of the flying distance, thus the smaller the head's flying clearance the smaller the magnetic "spot" of information). Manufacturers of disk drives strive to reach flying clearances close to 100 nanometers=0.1 micrometers (a human hair is about 100 micrometers thick). However, the head assembly must not touch the disk ("crash"), since the impact with the spinning disk (rotating at about 3600 rpm or faster) can destroy both the head, the surface of the disk, and the stored data.

Amplifying and control electronic circuits process, send, and receive the data signals to and from the head assembly. Signal transmission requires conductors between the dynamic "flying" head and the circuitry. Traditional head assemblies complete a read/write circuit loop with two conductors, usually copper wires encapsulated in a plastic sheeting. Newer magneto-resistance head assemblies require four or more independent conductors. The interconnect assembly includes the conductors and accompanying insulators and connectors.

Designers and manufacturers of HSAs face competing and limiting design considerations. During operation, the suspension assembly should be free of unpredictable loads and biases which alter the exact positioning of the head assembly. The suspension assembly should respond instantaneously to variations in the surface topology of a disk. Alterations to the flying height of the head can significantly affect data density and accuracy and even destroy the system in a crash.

Rigidity and stiffness increase in relation to the third power of cross-sectional thickness. To respond to air stream changes and to hold the flying head at the appropriate orientation, suspension assemblies are very thin and flexible, specially around the sensitive spring and gimbal areas. Interconnect assembly conductors have a large effect on suspension assembly performance. Conductor stiffness alone greatly affects the rigidity of the spring regions and flight performance. A standard conductor placed atop of a thin suspension can more than double a spring region's stiffness and detract from the ability of the spring region to adjust to variations in the surface of the disk, vibrations, and movement. The effect of the conductors on a gimbal region, the thinnest and most delicate spring in the suspension assembly, is even more pronounced. Conductors placed over spring regions must not plastically deform (become permanently bent) when the spring regions flex, since such deformation hinders the return of the spring to its normal position and applies a load on the suspension assembly.

The ideal HSA comprises components low in mass. Excessive inertial momentum caused by excessive mass can cause overshoot errors. Overshoot errors occur when momentum carries the whole HSA past the intended stopping point during positioning movement. Low-in-mass HSAs are also easier to move, resulting in power savings in multiple platter disk drives.

The manufacture of HSAs, like that of any commercial product, must be efficient. Reduction of manufacturing steps is desired. Damaged or misaligned components introduce biases and loads and drastically diminish the manufacturing useful output yield. Complex shaping and mounting processes are costly and decrease the reliability of the whole HSA manufacturing process.

To avoid defects and unpredictable loads and biases, exacting tolerances are necessary. During the HSA manufacturing and assembling process, the buildup of deviations from tolerance limits causes planar deviations that can affect the flying attitude of the head assembly. The parameters of static roll and static pitch torque in the final HSA result from these inherent manufacturing and assembly tolerance buildups.

Mounting and placement of current interconnect assemblies is usually done by hand. Hand mounting is imprecise and costly. Precise conductor placement is specially critical in the delicate gimbal region. As the industry transitions to smaller slider/transducer sizes to increase data storage density, limitations of the current interconnecting devices increase the potential for read/write errors and impose ceilings on data storage density.

Using current interconnect technology, workers bond two to five lengths of wire to the head assembly, using fixturing to manage the wires while adhesively bonding the head assembly to a stainless steel suspension. Next, the lengths of wire are shaped by hand, using tweezers and tooling assistance to form a service loop between the head assembly and the suspension assembly and to position the wire along a predetermined wire path on the suspension assembly. The wires are tacked to the suspension using adhesive or wire capture features formed into the suspension. Special care is taken to avoid pulling the service loop too tight or left too loose. A tight service loop places an unwanted torque on the slider causing flying attitude errors. Loose service loops allow the wire to sag down and scrape on the spinning disk. Both conditions are catastrophic to drive performance. Through-out the process of handling the slider and wires there is a risk of damaging the wires or the delicate load beam and gimbal. Load beams or gimbals accidentally bent during the manufacturing operations are scrapped. Often the head assembly also cannot be recovered, adding additional losses to the scrap pile.

Another type of suspension assembly interconnect utilizes plastic compounds acting as integral spring elements in the suspension assembly. Use of plastic materials as spring elements in load beam and gimbal construction presents performance problems since plastic materials do not possess optimal mechanical spring qualities. As the flying height and head size continually decrease in the progression towards greater disk storage density, the accuracy and control needed to align the transducer to the correct data track upon the disk surface becomes more critical.

During operating conditions the drive temperature operating ranges can span 80 degrees Celsius. Plastics expand and contract more than metals during temperature changes. The use of thermally expansive plastics as principal spring structural elements of the load beam or gimbal region affects the dimensional stability of the suspension assembly. The expansion and contraction of integral plastic spring elements introduces loads and stresses on the metal components. Additionally, because of their mechanical characteristics, integral plastic spring elements traditionally only have been used in suspension assemblies that resist the pull of negative pressure sliders, sliders that create a vacuum that pulls them toward the disk.

SUMMARY

The present invention is new laminate structures for use in head suspension assemblies (HSAs) and a method to manufacture the laminate structures. The present laminate structures eliminate manual handling of conductors by integrating the manufacture of the interconnect assembly with that of the suspension assembly. Reduction in handling minimizes handling damage, thereby reducing damaged components and increasing manufacturing yields. Since the suspension assembly and the interconnect assembly are manufactured together, the variability of the alignment of the component (standard deviation) is minimal. Errors during mechanical performance are therefore reduced. Conductor geometry is always precise and no expensive and time-consuming manual fixturing during assembly is required. Less handling, less bent parts, and less assembly errors result in a more consistent fly height performance and more efficient manufacturing process.

The first step in the manufacture of the laminate structures is to providing a multi-layer laminate sheet. The sheet comprises a first layer of a metal spring material, an intermediate second layer of an electrically insulating, preferably adhesive, material, and a third layer of an electrically conductive material. The second layer only provides minimal spring characteristics to the laminate structure as a whole. The third layer can be a conductive spring material such as beryllium copper.

The second step is to form the layers, starting from the outside in. A method of forming is chemical or plasma etching. The first layer is formed into a spring element. The third layer is formed into at least one trace, the trace including at least one elongated conductor configured for electrical coupling to a head assembly. The second element is formed into panels shaped as the areas of contact between the elements of the first and the third layer.

To complete manufacture of a head suspension assembly (HSA), the traces of the laminate structure are electrically coupled to a head assembly and the laminate structure is attached to other elements of the HSA.

Laminate structure embodiments include interconnect assemblies, interconnect-suspension assemblies, and gimbal-interconnect assemblies. Interconnect assemblies attach to a load beam and include at least one conductive trace. The second layer provides dielectric insulation and the third layer can include support and stiffening plates.

Interconnect-suspension assemblies include an interconnect assembly and a suspension assembly including a gimbal and a load beam having a rigid region and a spring region. The gimbal can be formed out of the first layer, the third layer, or both. The spring region of the load beam can also be formed out of either or both layers.

A interconnect-suspension assembly embodiment has a first layer of stainless steel, a thin second layer of polyimide, and a third layer of beryllium copper. The first layer has a planar load beam plate including a rigid region. The third layer has at least one trace for electrical coupling to the head assembly, each trace including a gimbal region at a distal end portion and a load beam region at a proximal end portion. The gimbal region is shaped as a gimbal spring arm. The second layer has at least one panel, the panels placed in between overlapping areas of the first layer and of the third layer.

DETAILED DESCRIPTION OF THE INVENTION

Figure 1:
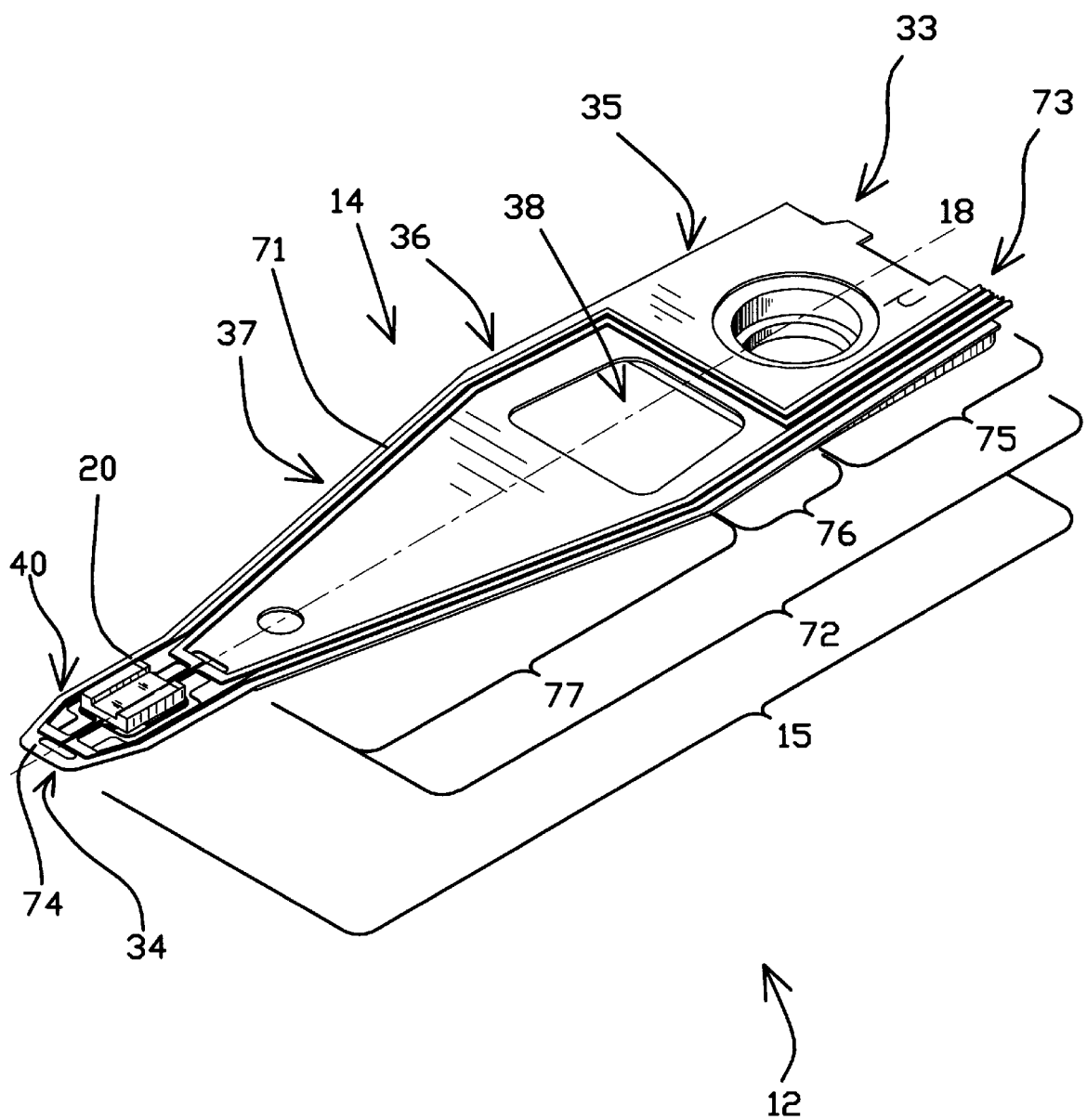
FIG. 1 is a perspective view of a head suspension assembly in accordance with the present invention.

FIG. 1 shows a HSA 12 manufactured in accordance with the present invention aligned with longitudinal axis 18. HSA 12 includes an interconnect-suspension assembly 14 and a head assembly 20 attached to a distal end of the interconnect-suspension assembly 14. Interconnect-suspension assembly 14 comprises a load beam 32 (better seen in FIG. 4), an interconnect assembly 15, and a gimbal 40. Load beam 32 includes a proximal end 33, a distal end 34, a base region 35 at the proximal end 33, a rigid region 37 at the distal end 34, and a spring region 36 in between base region 35 and rigid region 37. Spring region 36 has a spring aperture 38 used to tailor the stiffness of the spring region 36.

Figure 6:
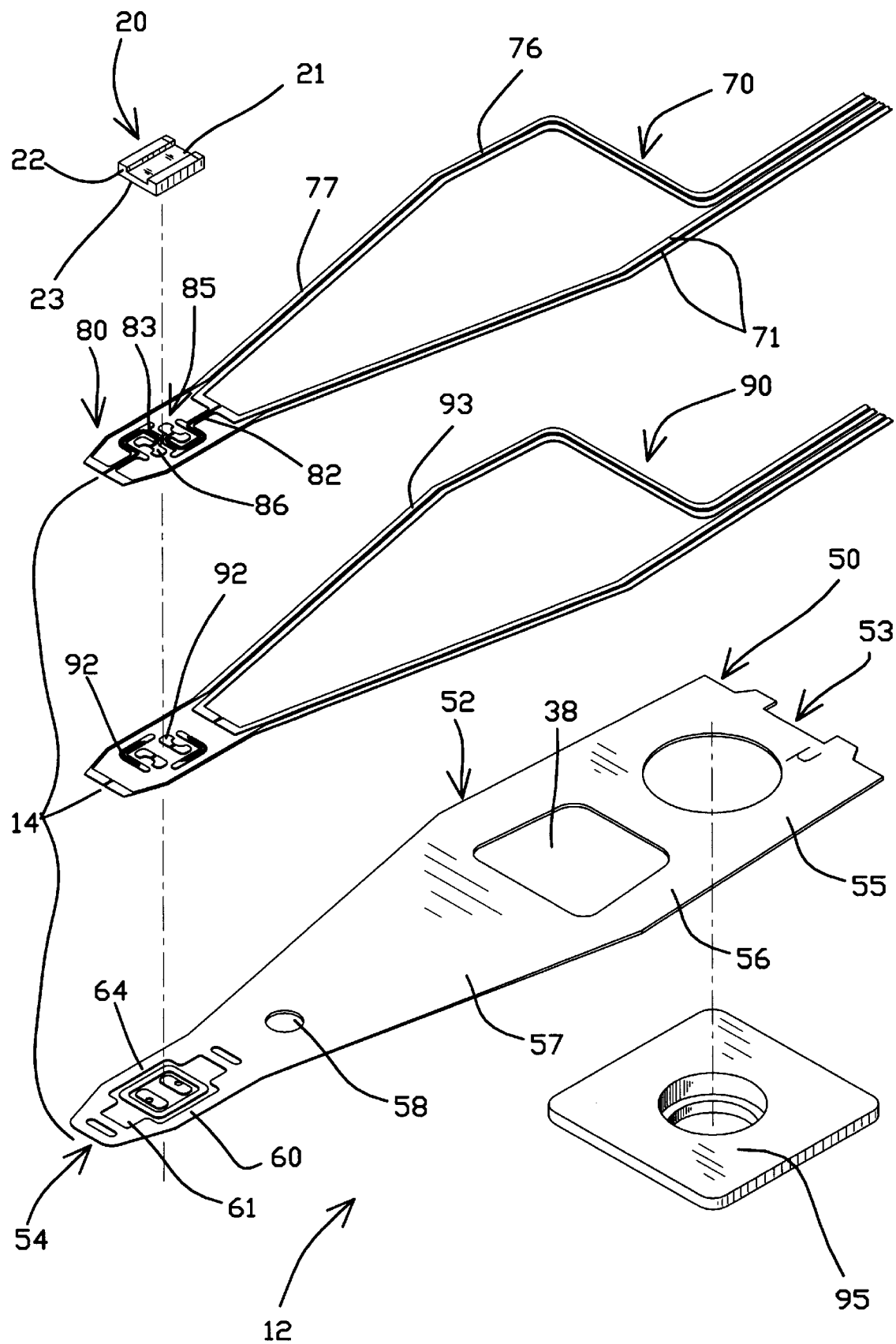
FIG. 6 is an exploded perspective view of the suspension assembly shown in FIG. 1 manufactured from the three-layer sheet shown in FIG. 3 wherein the exposed areas of the second layer have been etched away.
Figure 21:
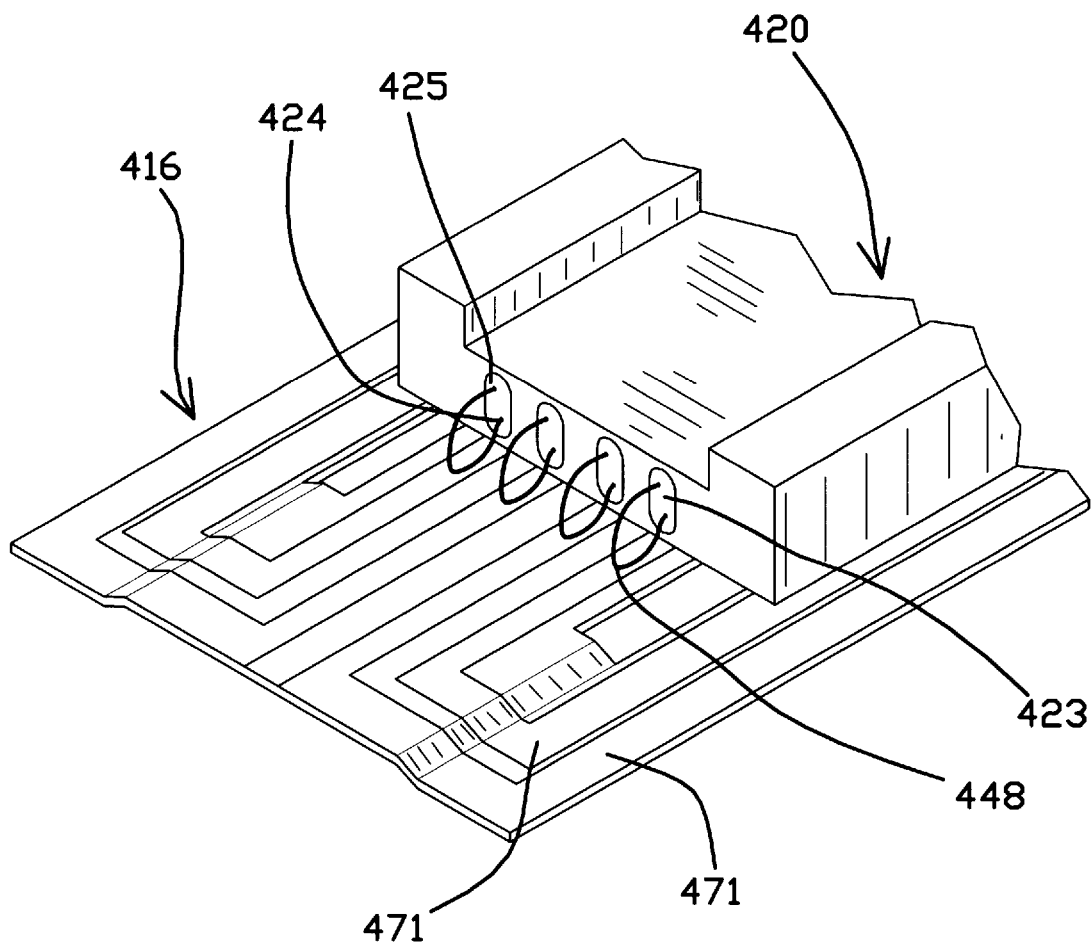
FIG. 21 is an enlarged detail perspective view of vertically mounted head electrical terminals electrically coupling to traces of a gimbal-interconnect assembly.
Figure 22:
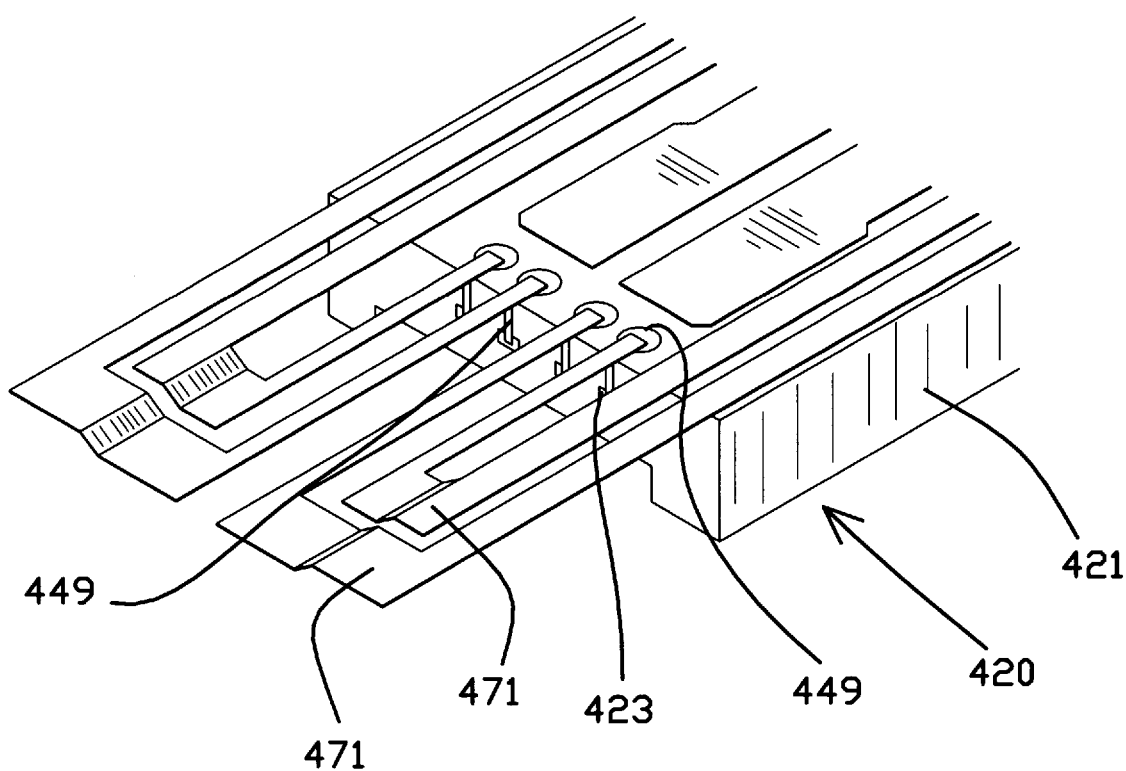
FIG. 22 is an enlarged detail perspective view of another method of coupling horizontally mounted head electrical terminals electrically to traces of a gimbal-interconnect assembly.
Figure 23:
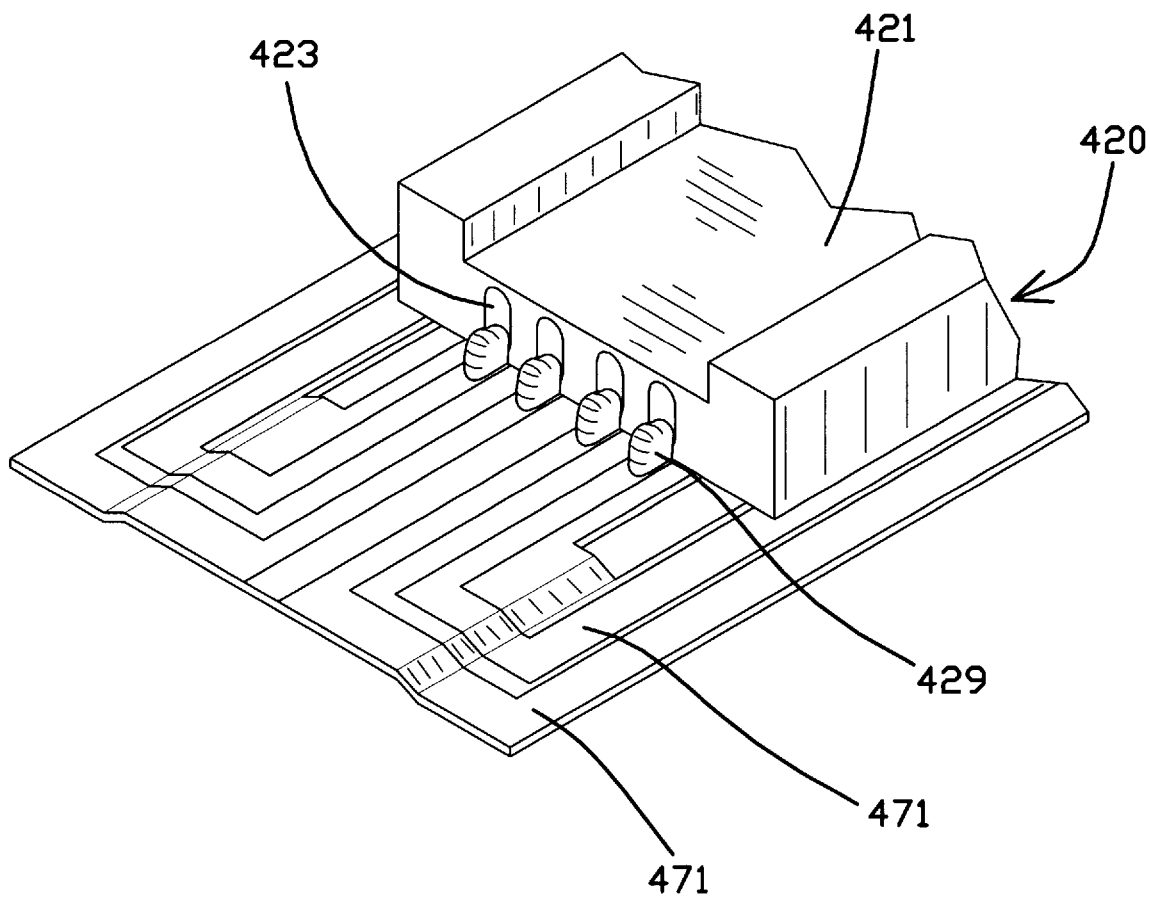
FIG. 23 is an enlarged detail perspective view of another method of coupling the vertically mounted head electrical terminals electrically to traces of a gimbal-interconnect assembly.

Interconnect assembly 15 comprises four traces 71 extending the length of the load beam 32, insulation panels 92 and 93 shown in FIG. 6, and connector means shown in FIGS. 21–23 (other embodiments can include connector means known in the art). Traces 71 are elongated and resilient pre-patterned electrical conductors that connect the head assembly 20 to amplifying and control electronics (not shown). The traces 71 include a proximal end 73, a distal end 74, a load beam region 72 adjacent the proximal end 73, and a gimbal region 80 adjacent the distal end 74. The width and the thickness of traces 71 can change at different regions to affect stiffness or to change the electrical resistance.

The load beam region 72 of traces 71 includes a proximal base region 75, a middle spring region 76, and a distal rigid region 77. In the present embodiment, the gimbal regions 80 of traces 71 are shaped as elements of gimbal 40. The excellent mechanical and electrical properties of BeCu allow the third layer 70 to act not only as an interconnect assembly, but also as a spring element. The present interconnect assembly 15 acts as both an interconnect assembly and as a gimbal, and is therefore a gimbal-interconnect assembly.

In the present embodiment, the rigid regions 77 of the traces 71 also act as stiffening rails that give added rigidity to the rigid region 37 of the interconnect-suspension assembly 14 to modify the resonance response of the interconnect-suspension assembly. The thickness and/or width of the rigid region 77 of the traces 71 can be increased to increase their stiffness. In FIG. 1, the traces 71 only extend slightly past the proximal end 33 of the HSA 12. The traces 71 can extend all the way back to amplifying and processing circuitry placed on the actuator arm (not shown) or on the frame of the disk drive (also not shown).

Figure 2:
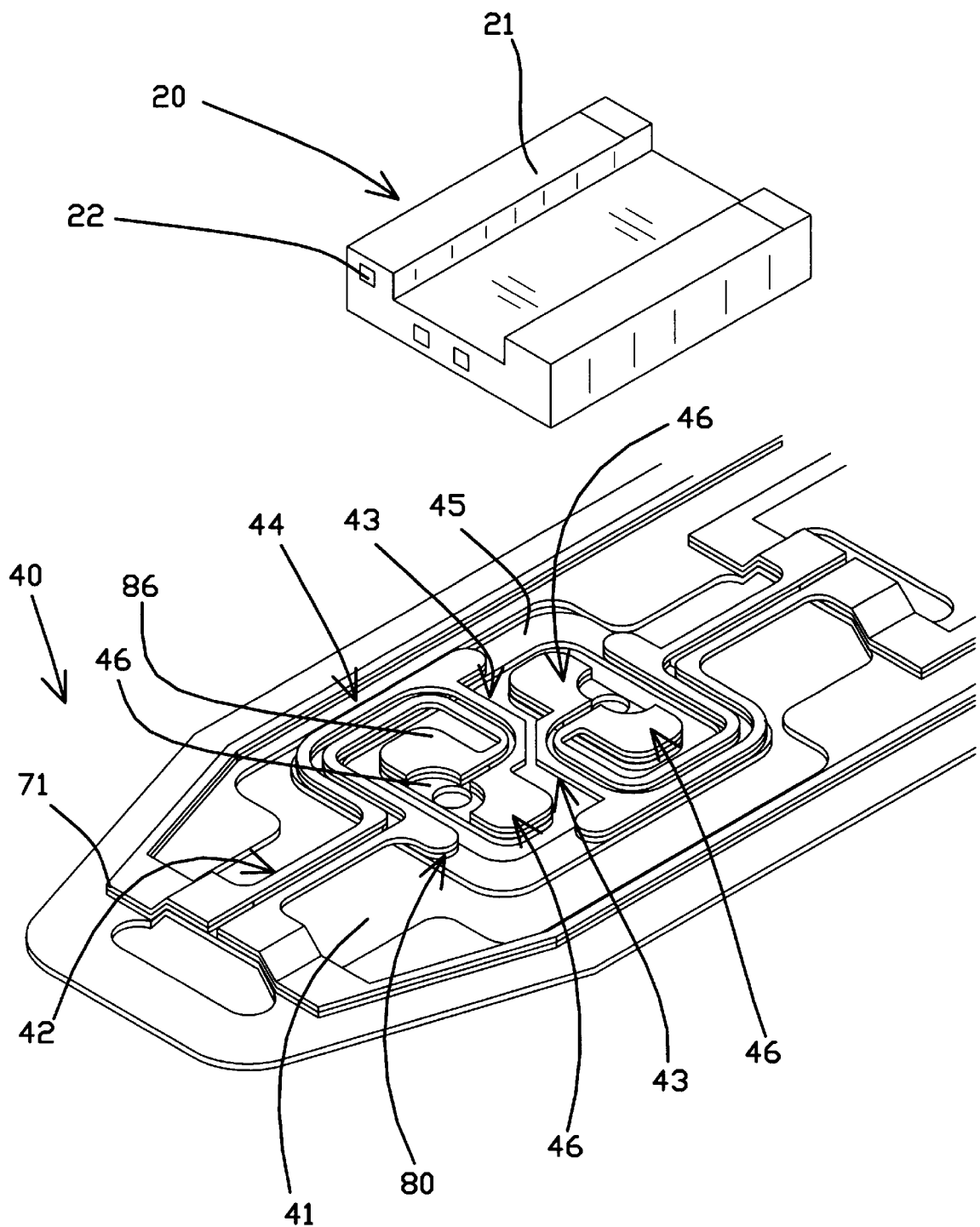
FIG. 2 is a detail enlarged view of the gimbal of the head suspension assembly shown in FIG. 1.

FIG. 2 shows a detail enlarged view of gimbal 40. Gimbal 40 provides gimballing support to the head assembly 20, that is, maintaining the head assembly 20 correctly oriented and equidistant to the rotating disk, regardless of the movements and twists experienced by the load beam 32 during actuator motion. Gimbal 40 includes longitudinal spring arms 42 suspending a platform 44 over an aperture 41 on the load beam 32. Platform 44 has a frame 45 encircling two bond pads 46 suspended by lateral spring arms 43.

Head assembly 20 includes an air-bearing slider 21, a read/write transducer 22 attached to the slider 21, and electrical terminals 23, better seen in FIG. 21, for electrically coupling to the transducer 22. The slider 21 is attached by conductive epoxy to bond pads 86 of the gimbal region 80 of the traces 71.

Figure 3:
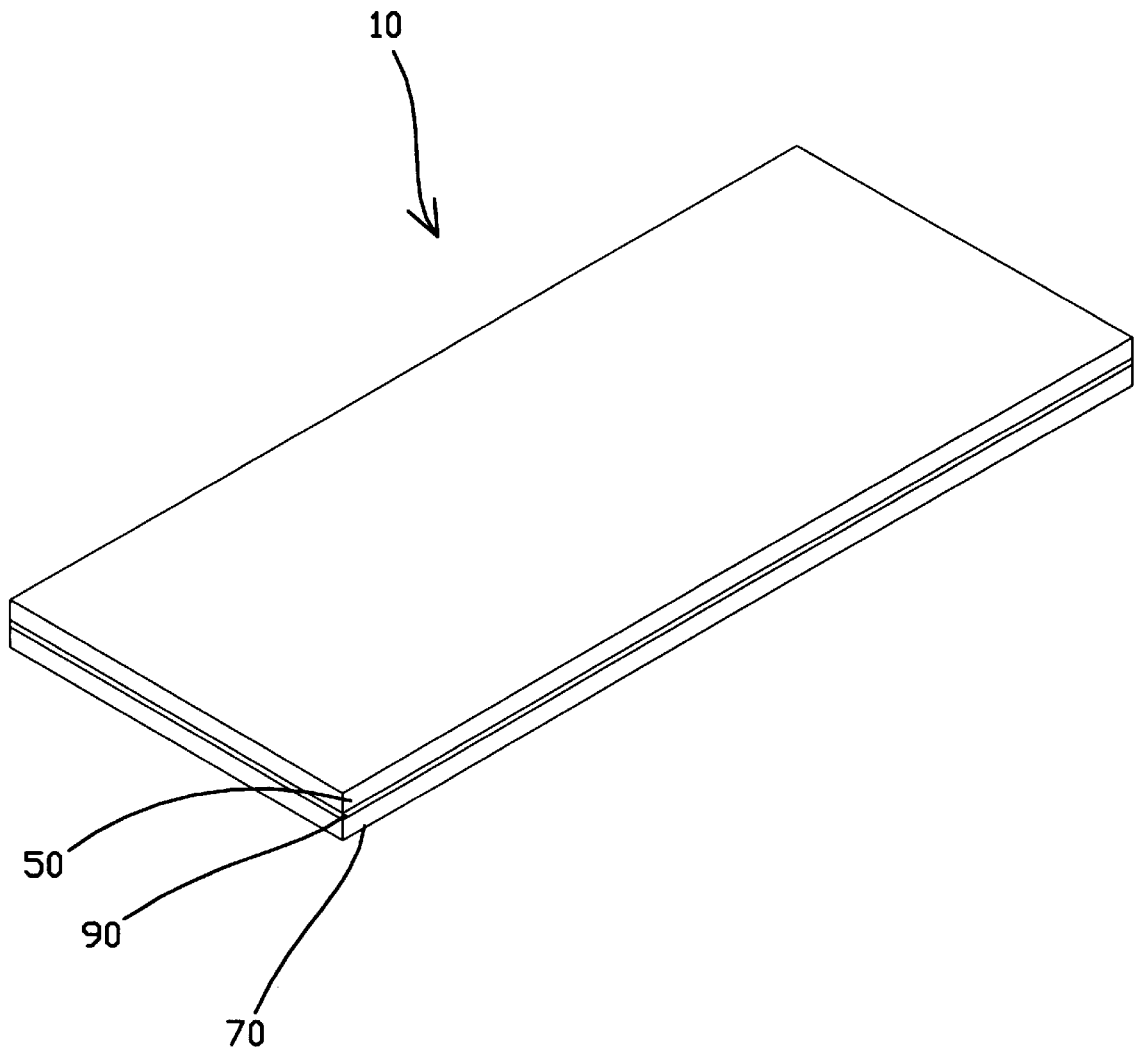
FIG. 3 is a perspective view of a three-layer sheet of laminate material used to manufacture laminate structures in accordance with the present invention.

The first step in the manufacture of laminate structures in accordance with the present invention is to provide a multi-layer laminate sheet 10 such as the one illustrated in FIG. 3. The sheet 10 has three layers, a first layer 50, a middle second layer 90, and a third layer 70. Other laminate structure embodiments not shown can be manufactured out of sheets with more layers.

The first layer 50 is about 63.5 micrometers-thick and will typically range from 20 to 90 micrometers in other embodiments. In the drawings, elements of the first layer 50 are numbered between 50 to 69. First layer 50 is a sheet of 1.14 gigapascal yield strength and 1.31 gigapascal tensile strength stainless steel, a metal spring material. Other spring materials can also be used. Spring materials are those that do not plastically deform (yield) under the most extreme loads applied during HSA use.

The second layer 90 is a thin 25 micrometers thick sheet of epoxy, an adhesive and dielectric or insulating material. The second layer 90 joins and insulates the fist layer 50 and the third layer 70. The second layer 90 provides only minimal spring characteristics to the whole laminate structure in comparison to the first layer 50 and the third layer 70. The second layer 90 will typically range from 5 to 60 micrometers in other embodiments. Other embodiments, shown in FIGS. 7–9, use thermoplastic polyimide. Ideal materials for the second layer 90 have good electrical characteristics—low dielectric constant, high dielectric resistance, and high dielectric strength. To prevent shift or shear (lateral sliding of the layers with respect to each other) and to assure mechanical stability through time and temperature cycles, the second layer 90 optimally has a high elastic modulus and a temperature coefficient closely matching that of the first layer 50 and that of the third layer 70. In still other embodiments, the second layer 90 does not act as an adhesive, and additional adhesive layers are added to attach first layer 50 and third layer 70. Elements of the second layer 90 are numbered 90 to 99.

The third layer 70 is about 25 micrometers thick and will typically range from 10 to 90 micrometers thick in other embodiments. Elements of the third layer 70 are numbered between 70 to 89. In the present embodiment, the third layer 70 is a sheet of beryllium copper UNSC 17200 (BeCu), a conductive metal spring material with a yield strength of about 1.24 gigapascals and a tensile strength of about 1.31 gigapascals. Other embodiments include other conductive spring materials. Still other embodiments, where the third layer 70 is not used as a spring layer, use non-spring conductive materials.

The second step in the manufacture of laminated structures is to form and pattern the two outside metal layers, first layer 50 and third layer 70, into elements for the desired laminate structure. Forming can be accomplished by chemical etching or other methods known in the art such as electro-discharge machining (EDM). Both the first layer 50 and the third layer 70 can be chemically etched in a variety of continuous or discontinuous patterns using common etchants such as ferric chloride. Either the first layer 50 or the third layer 70 can be etched first. Layers 50 and 70 can even be etched simultaneously. Laminate construction allows manufacturing using materials that are thinner than those normally capable of being processed. The second layer 90 supports the metal layers 50 and 70 throughout the etching process and allows higher manufacturing yields of components with fragile and/or discontinuous geometries.

Figure 4:
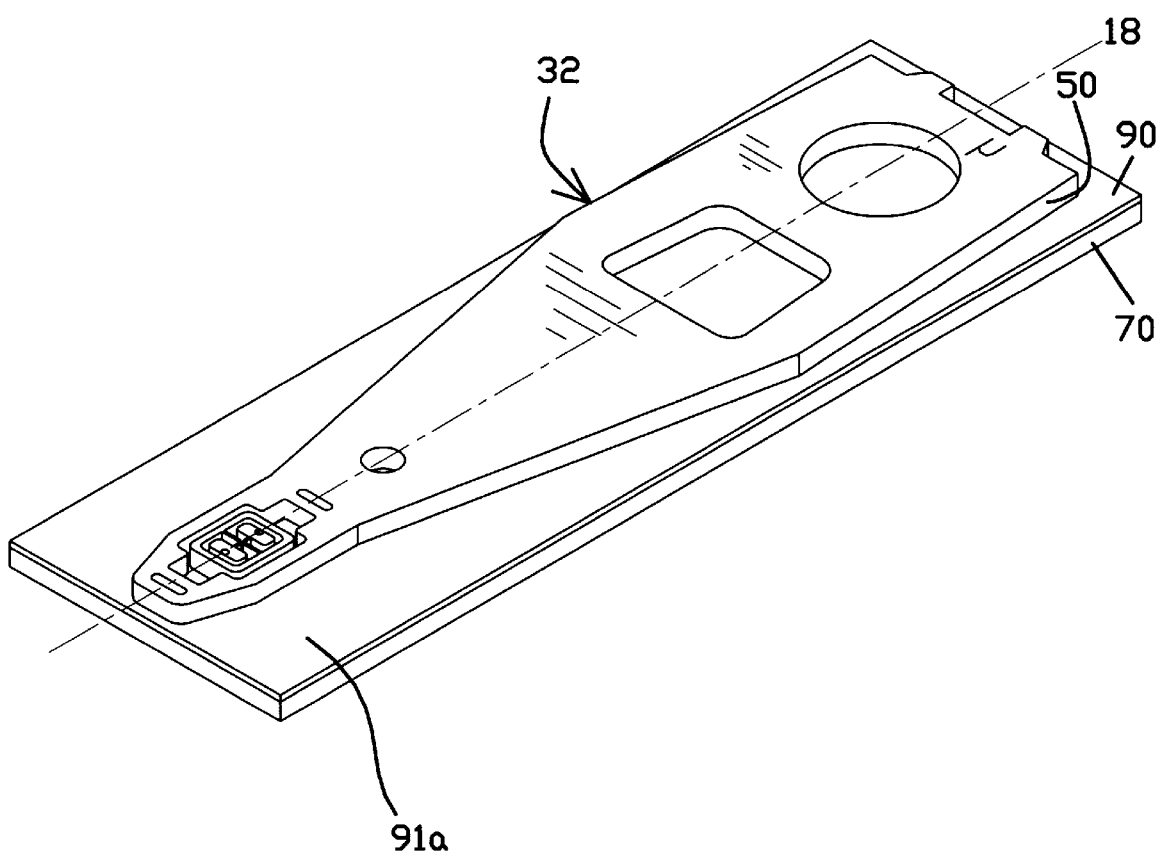
FIG. 4 is a perspective view of one side of the three-layer sheet shown in FIG. 3 after the stainless steel layer has been etched into a load beam.

FIG. 4 shows the result of the step of etching the first layer 50 of sheet 10 into elements for the HSA 12 of FIG. 1. The etching process exposes areas 91A of the second layer 90 not overlapped by elements of the first layer 50. The thickness of layer 50 is greatly exaggerated to better illustrate the relief etching. One step double-sided exposure in an etching process with multi-step etching provides tight alignment of top and bottom features. Multiple step exposure also can be used to partially etch the first layer 50 or the third layer 90.

Figure 5:
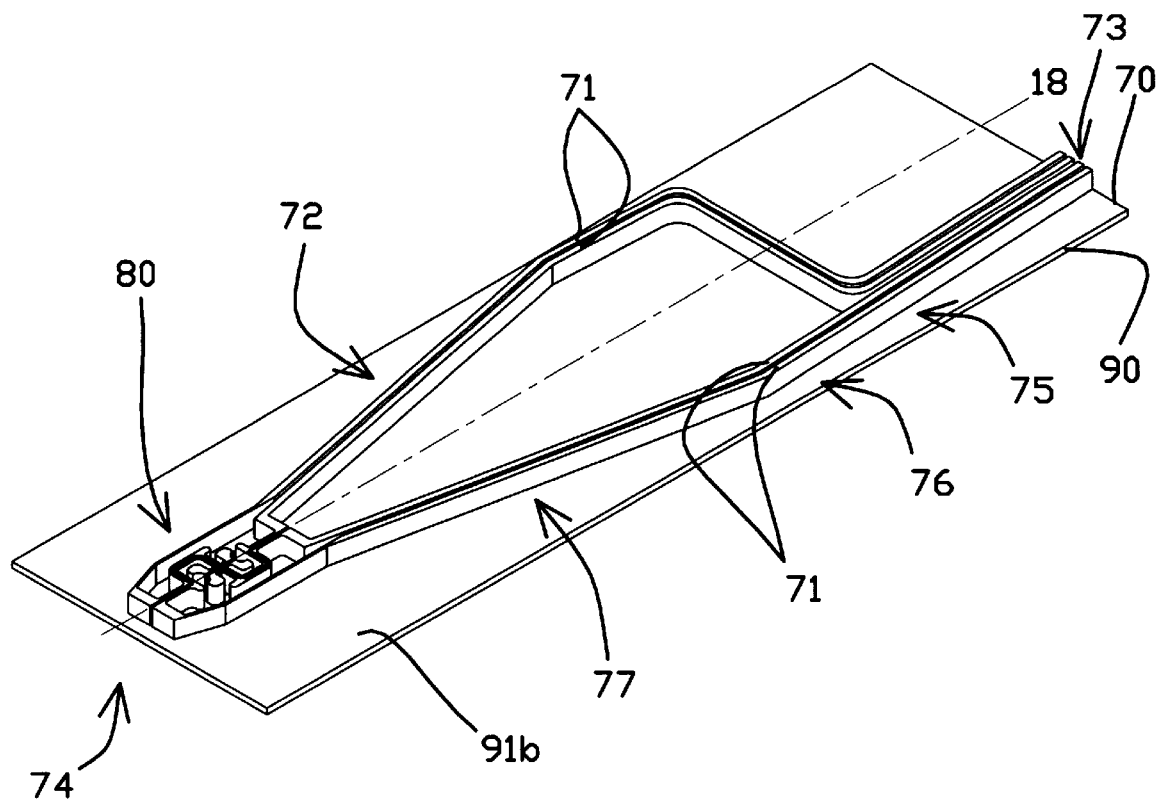
FIG. 5 is a perspective view of the other side of the three-layer sheet shown in FIG. 3 after the beryllium copper layer has been etched into a traces for a gimbal-interconnect assembly.

FIG. 5 shows the result of the step of etching the third layer 70 as elements of the interconnect assembly of the HSA 12 of FIG. 1. Etching of the third layer 70 again exposes areas 91B of the second layer 90 not overlapped by elements of the third layer 70. The thickness of the four traces 71 is exaggerated to accentuate the relief etching. The traces 71 are electrically isolated from each other. Separation between the traces 71 is controlled by the etching process and maintained by the second layer 90.

The second layer 90 acts as a hard stop during the chemical etching of the metal layers 50 and 70. The intervening second layer 90 allows each metal layer 50 and 70 to have a different geometry. The BeCu third layer 70 can be etched with cupric chloride to avoid a masking step on the stainless steel first layer 50 of the laminate sheet 10.

The third step in the manufacture of laminate structures comprises plasma etching the second layer 90. The second layer 90 can be shaped using other methods known in the art such as chemical etching or laser cutting. The first layer 50 and third layer 70 can act as metal etching masks during the etching of the second layer 90. FIG. 6 shows the second layer 90 etched into a plurality of panels 92 and 93. The panels 92 and 93 are etched to allow elements of the first layer 50 and of the third layer 70 to act as the main spring elements of the HSA 12. To free the spring elements of the first layer 50 and/or the third layer 70 and to reduce stiffness and mass, all exposed areas 91 of the second layer 90, that is all areas not overlapped by both the first layer 50 and the third layer 70, and thus not used for insulation or for bonding, have been etched away. The exposed areas 91 are excess material. However, a manufacturer can choose various times along the HSA 12 manufacturing process at which to etch-away the exposed areas 91 and remove the excess material. The excess material helps the second layer 90 to act as a backing support to prevent handling damage. The etched first layer 50, second layer 90, and third layer 70 together form the interconnect/suspension assembly 14.

A fourth manufacturing step can comprise plating selected areas of the first layer 50 and the third layer 70. To improve terminal contacts plating nickel, gold, silver, tin, etc. can be applied on connector sites of the third layer 70, such as the proximal end 73 and the distal end 74. The second layer 90 also acts as an insulator during electroplating processes. Plating or other passivation is also useful to protect the entire third layer 70 from corrosion.

The fifth and final step in the manufacture of HSA 12 is to attach the interconnect/suspension assembly 14 to all other elements. FIG. 6 shows an exploded view of the head suspension assembly (HSA) 12, including the head assembly 20 and a supporting base plate 95. The etched layers 50, 70, and 90 create the interconnect/suspension assembly 14.

Exploded views are shown merely for illustration purposes. Since laminate structures are etched directly out of laminate sheet 10, the different etched layers 50, 70, and 90 are not separated during manufacturing or operation. All elements of a same layer are co-planar when initially etched, however, forming operations may be included in later steps.

Only the first layer 50 and the third layer 70 include structural spring elements. First layer 50 includes a load beam plate 52 and a gimbal platform 64. Load beam plate 52 is a wedge-shaped spring member aligned along the longitudinal axis 18 and includes a proximal end 53, a distal end 54, a base region 55 adjacent to the proximal end 53, a spring region 56 contiguous to the base region 55, a rigid region 57 contiguous to spring region 56, and a gimbal region 60 which is adjacent to the distal end 54. The rigid region 57 includes a tooling and alignment hole 58. The gimbal region 60 has a central aperture 61. The gimbal platform 64 rests in the middle of aperture 61.

Third layer 70 includes the four traces 71. The spring region 76 and the rigid region 77 match the outer outline of the corresponding spring region 56 and rigid region 57 of the underlying load beam plate 52 of the first layer 50. The gimbal region 80 of each trace 71 of the third layer 70 is configured as a portion of the gimbal 40 and includes a longitudinal spring arm region 82, a lateral spring arm region 83, that broadens into a horizontal bond pad 86. The spring arm regions 82 and 83 and bond pads 86 form a platform 85 that partially matches the platform 64 of the first layer 50. In other embodiments (not shown), the third layer 70 can also be shaped only as an interconnect assembly and perform no gimballing functions.

The second layer 90 includes small gimbal panels 92 and trace insulation panels 93. The gimbal panels 92 insulate, separate, and join the gimbal region 80 of the traces 71 to the platform 64 of the first layer 50. The trace panels 93 extend underneath traces 71 and insulate the traces 71 from the load beam plate 52. Although a support element during manufacture, the second layer 90 does not act as a spring or hinge element during operation of the HSA 12.

The use of metal spring elements minimizes the dimensional stability concerns that afflict laminate structures that use a plastic spring element. The panels 92 and 93 act as insulators, as bonding agents, and as dampers that reduce vibration and settling times (time needed for the HSA 12 to settle after rapid positional movement). Additional service panels can be added to increase damping characteristics.

Figure 7:
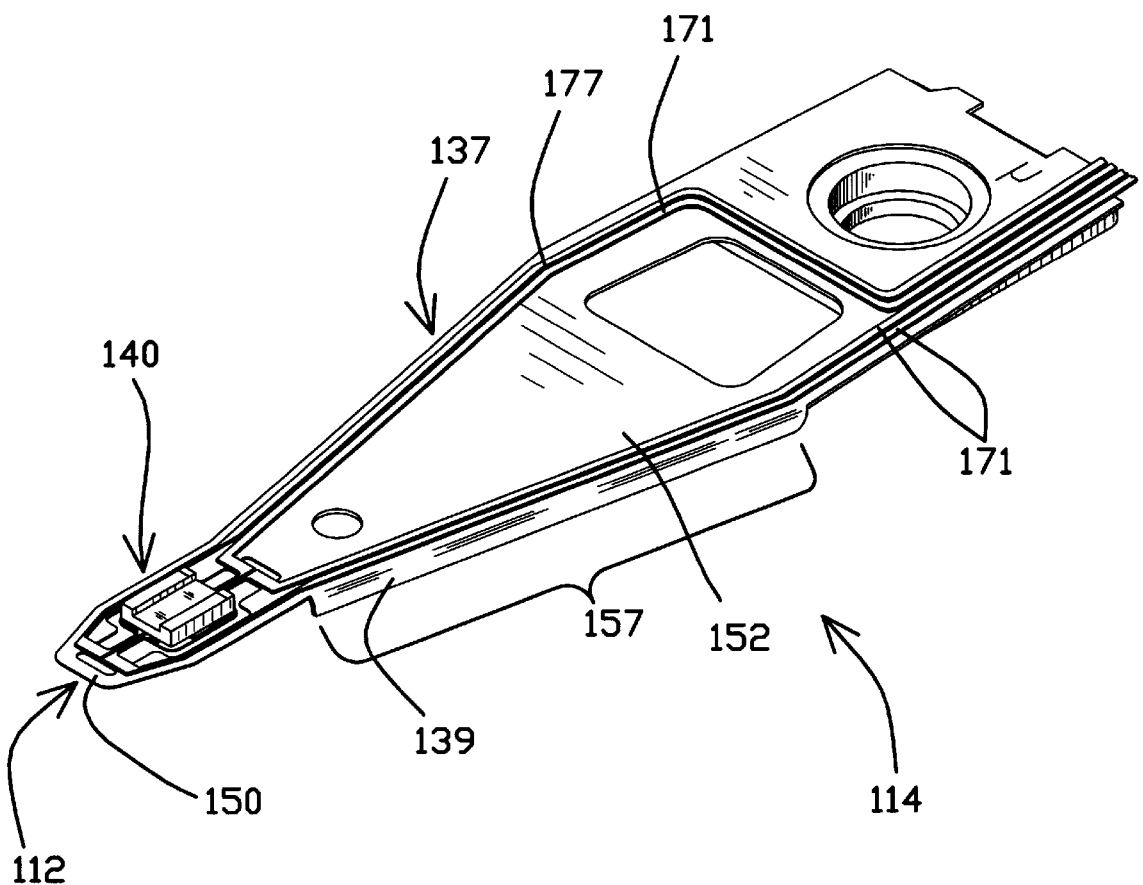
FIG. 7 is a perspective view of a second embodiment of a head suspension assembly in accordance with the present invention, the load beam including stiffening side rails.
Figure 8:
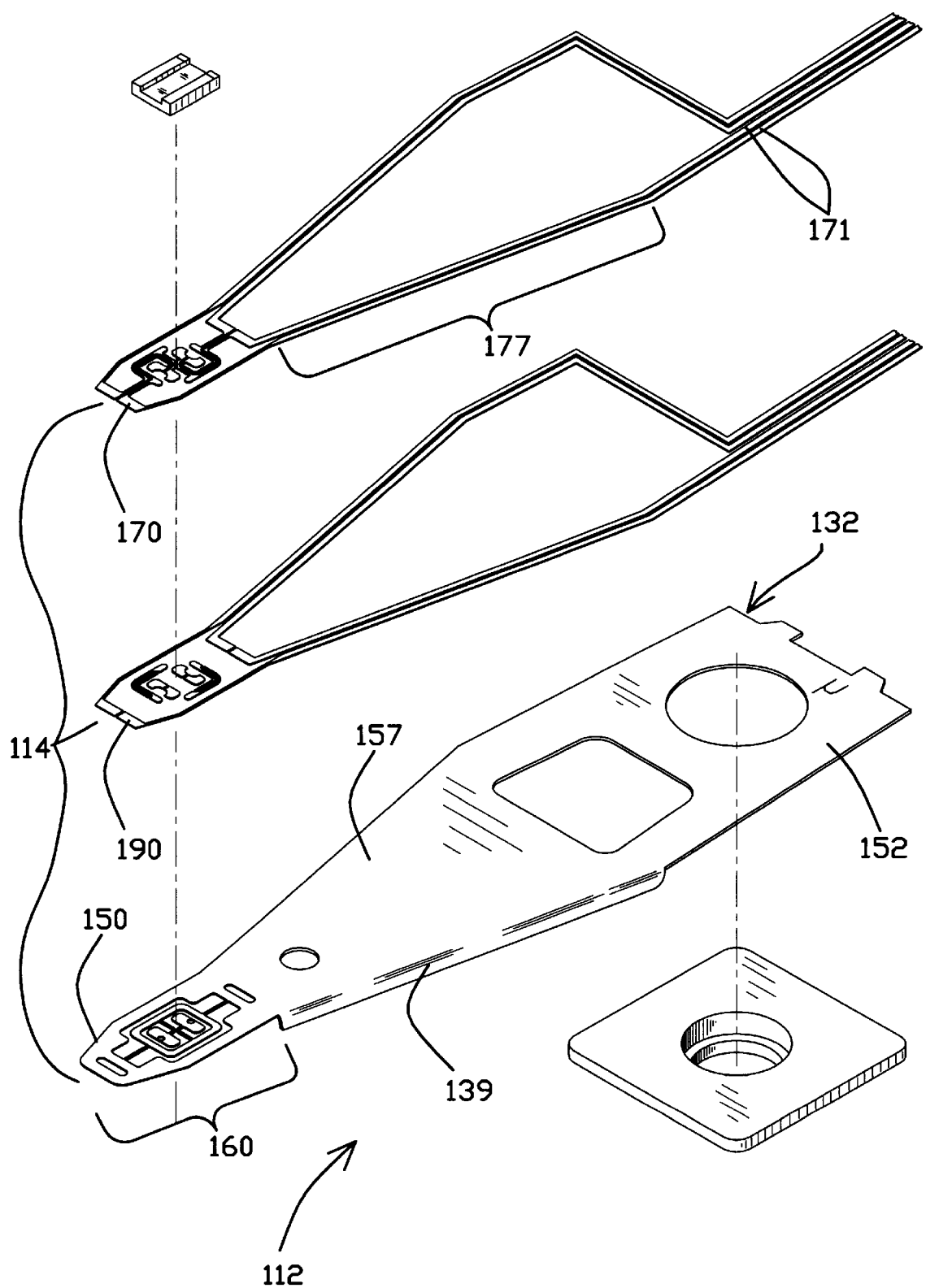
FIG. 8 is an exploded perspective view of the head suspension assembly shown in FIG. 7 including the three-layer suspension assembly, the head assembly, and the supporting base plate.

FIGS. 7 and 8 show a HSA 112 including elements similar to the elements of HSA 12 of FIG. 1. Elements in all embodiments are identified by the same last two numbers as used for similar elements of HSA 12. An additional first number is used to refer to the HSA embodiment shown. HSA 112 includes a an interconnect-suspension assembly 114 having a gimbal 140 and a load beam 132 with side rails 139. Interconnect-suspension assembly 114 includes a first layer 150, a second layer 190, and a third layer 170.

In the present embodiment, side rails 139 are formed by manufacturing a load beam plate 152 out of the first layer 150. The load beam plate 152 can be reinforced or even replaced by plates from the third layer 170 and the second layer 190. Load beam plate 152 includes a gimbal region 160 and a rigid region 157. Load beam plate 152 includes small wings projecting along longitudinal edges of the rigid region 157 of the load beam plate 152 of the first layer 150. The wings are bent generally perpendicularly to the surface of the load beam plate 152 to form the side rails 139.

Traces 171 are etched out of the third layer 170. The traces 171 have rigid region 177 that also reinforces the rigid region 157 of load beam plate 152.

Figure 9:
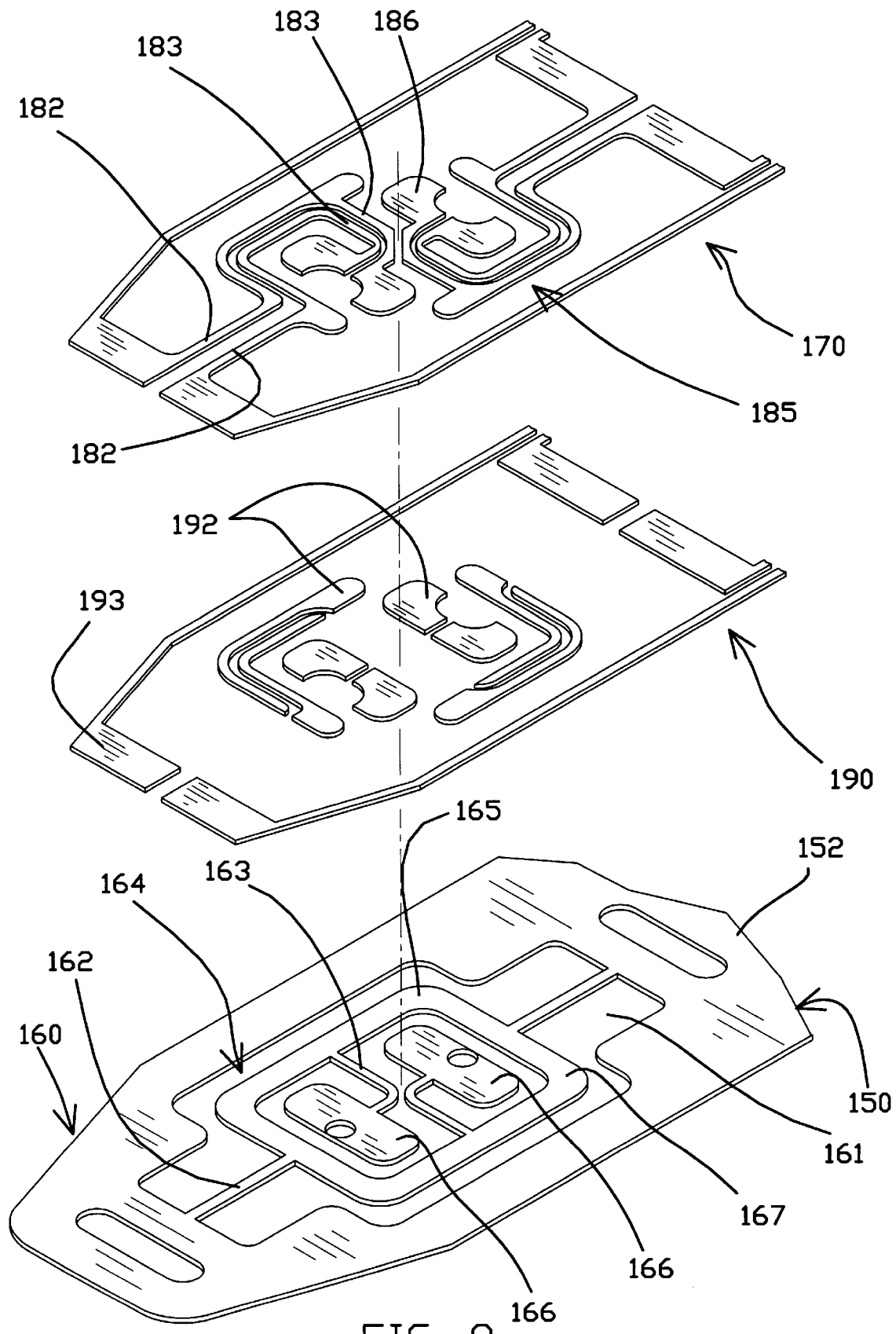
FIG. 9 is an enlarged detail perspective view of the three layers of the gimbal of the head suspension assembly shown in FIG. 7.

FIG. 9 shows an enlarged exploded detail of the gimbal 140 of the HSA 112. In this embodiment, the first layer 150 and the third layer 170 compliment and support each other to together create the gimbal 140. In other embodiments, either third layer 170 (embodiment of FIG. 1) or first layer 150 (embodiment not shown) can be the principal gimbal spring elements. Although only a few gimbal embodiments are shown in the drawings, the first layer 150 and the third layers 170 can be etched into almost any gimbal design known in the art.

In the present embodiment, the load beam plate 152 of the first layer 150 has longitudinal arms 162 that suspend a gimbal platform 164 in the middle of an aperture 161 in the gimbal region 160 of load beam plate 152. The platform 164 includes two mechanical bond pads 166 attached inside of frame 165 by lateral spring arms 163.

The longitudinal spring arms 162 and the lateral spring arms 163 of the first layer 150 compliment straddling longitudinal spring arms 182 and lateral spring arms 183 of the third layer 170. The first layer arms 162 and 163 and the third layer arms 182 and 183 do not overlap, thus creating thin and very responsive one-layer thick spring elements. The traces 171 of the third layer 170 end in bond pads 186 that are placed over the bond pads 166 of the first layer 150 and match their outline. Panels 192 and 193 of the second layer 190 insulate, separate, and adhesively bond the elements of the first layer 150 and the elements of the third layer 170.

Figure 10:
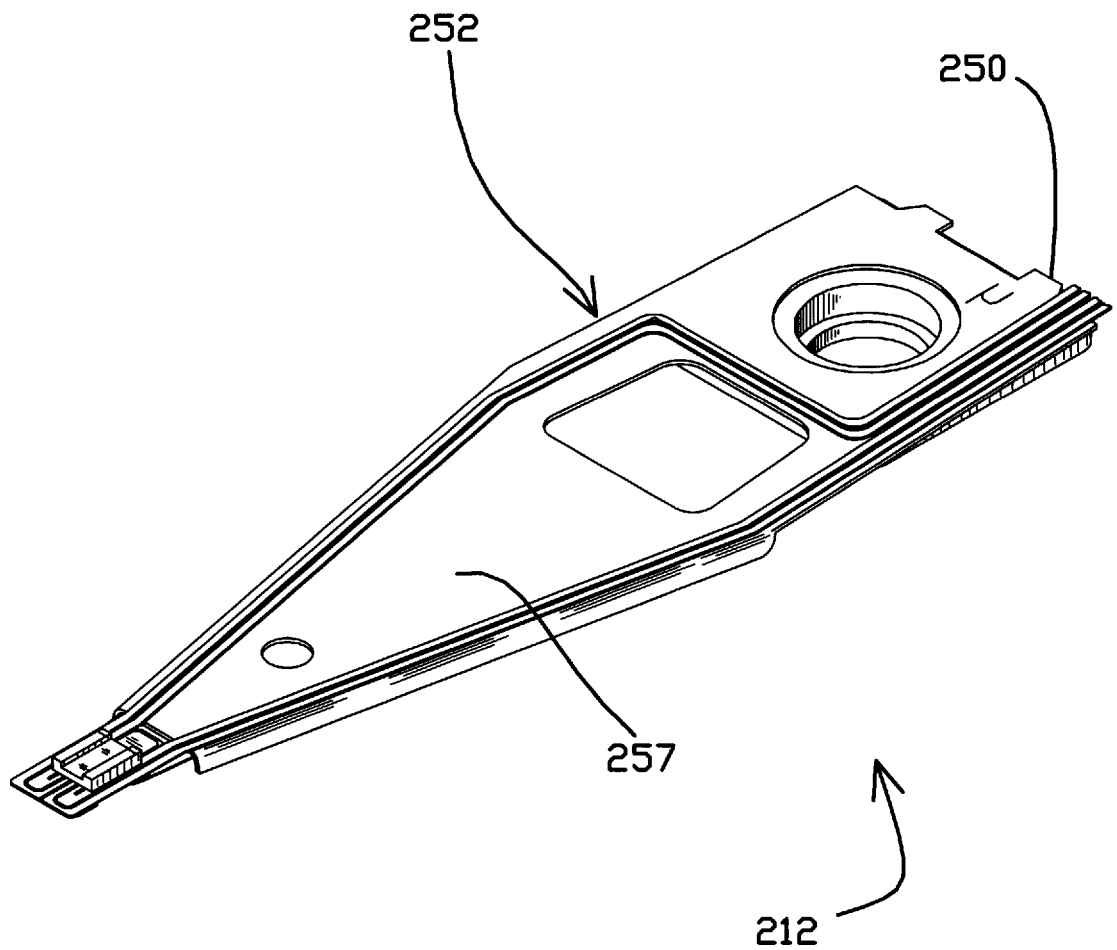
FIG. 10 is a perspective view of a third embodiment of a head suspension assembly in accordance with the present invention.
Figure 11:
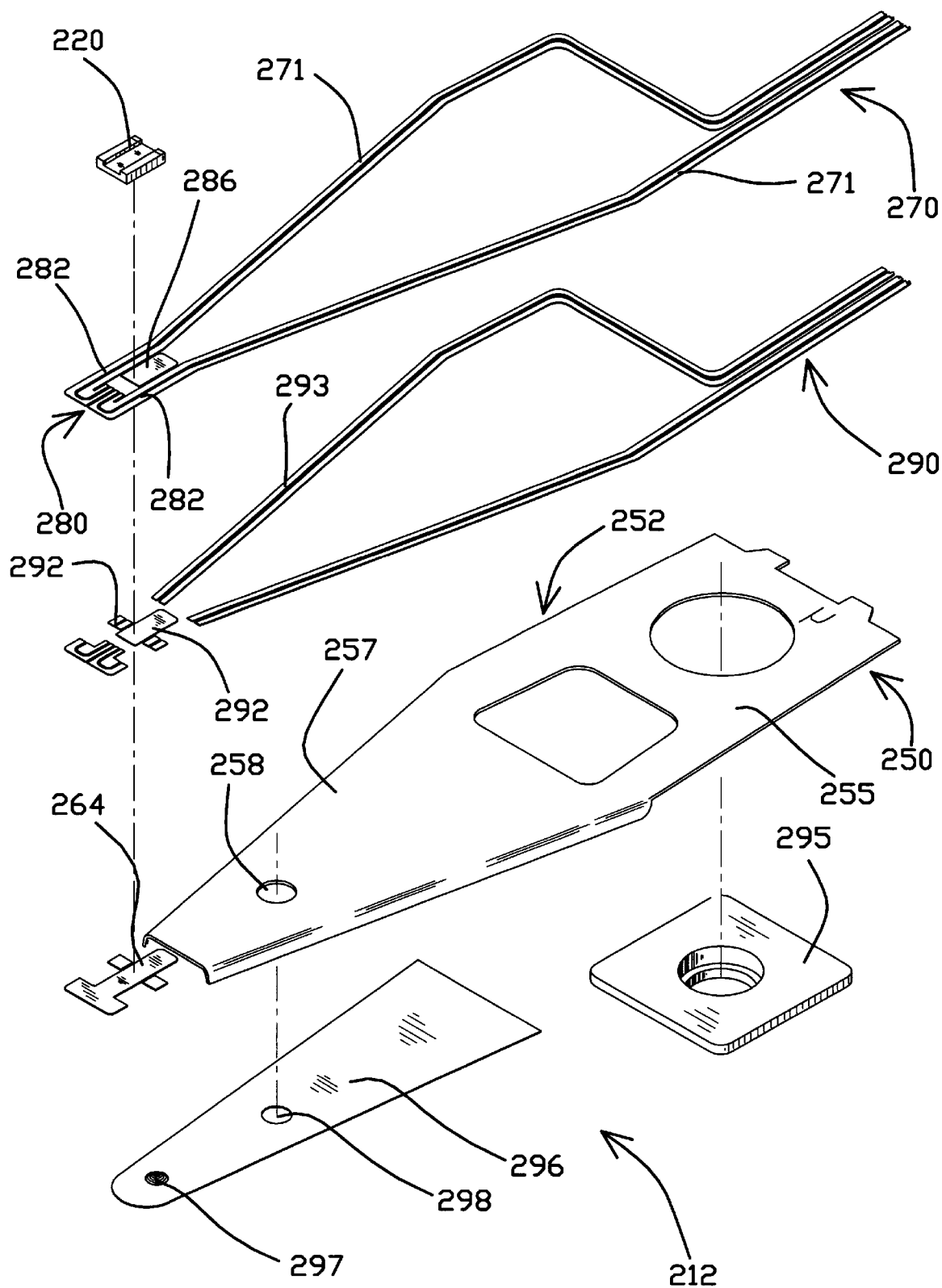
FIG. 11 is an exploded perspective view of the head suspension assembly shown in FIG. 10 including a three-layer suspension assembly, a head assembly, a supporting base plate, and a load button cover.

FIGS. 10 and 11 show a HSA 212 wherein first layer 250 includes a load beam plate 252 truncated at the end of rigid region 257 and a separate "T" shaped gimbal tongue 264. The tongue 264 acts as a base gimbal platform for mounting a head assembly 220. The second layer 290 includes trace pads 293 and gimbal pads 292 separating, joining, and insulating the elements of the first layer 250 and the elements of the third layer 270. The third layer 270 includes traces 271 and a single wide horizontal bond pad 286 that matches and attaches, through a second layer panel 292, to a proximal portion of the tongue 264 of the first layer 250.

The tongue 264 is supported by spring arms 282 of a gimbal portion 280 of traces 271. The gimbal portion 280 is formed or rolled according to methods known in the art to achieve slider offset, that is vertical separation so that the head assembly 220 may move freely. The spring arms 282 extend past the distal end of the truncated load beam 252 and run along both sides of the bond pad 286. At the distal end of the bond pad 286, the arms 282 loop 180 degrees and end adjacent the bond pad 286. Head assembly 220 is attached to bond pad 286 and is electrically coupled to traces 271.

FIG. 11 shows an exploded view of the HSA 212 of FIG. 10. The T-tongue 264 and the bond pad 286 can be seen more clearly. A supporting base plate 295 attaches to a base region 255 of the load beam plate 252. A new element, a load button cover 296, attaches to rigid region 257 of the load beam plate 252. Load button cover 296 is a triangle-shaped stainless steel plate including a pivoting gimbal load button 297 and an alignment hole 298. Cover 296 attaches to the bottom surface of load beam plate 252. Alignment hole 298 aligns with hole 258 of the load beam plate. Load button 297 is a protruding dimple.

Figure 12:
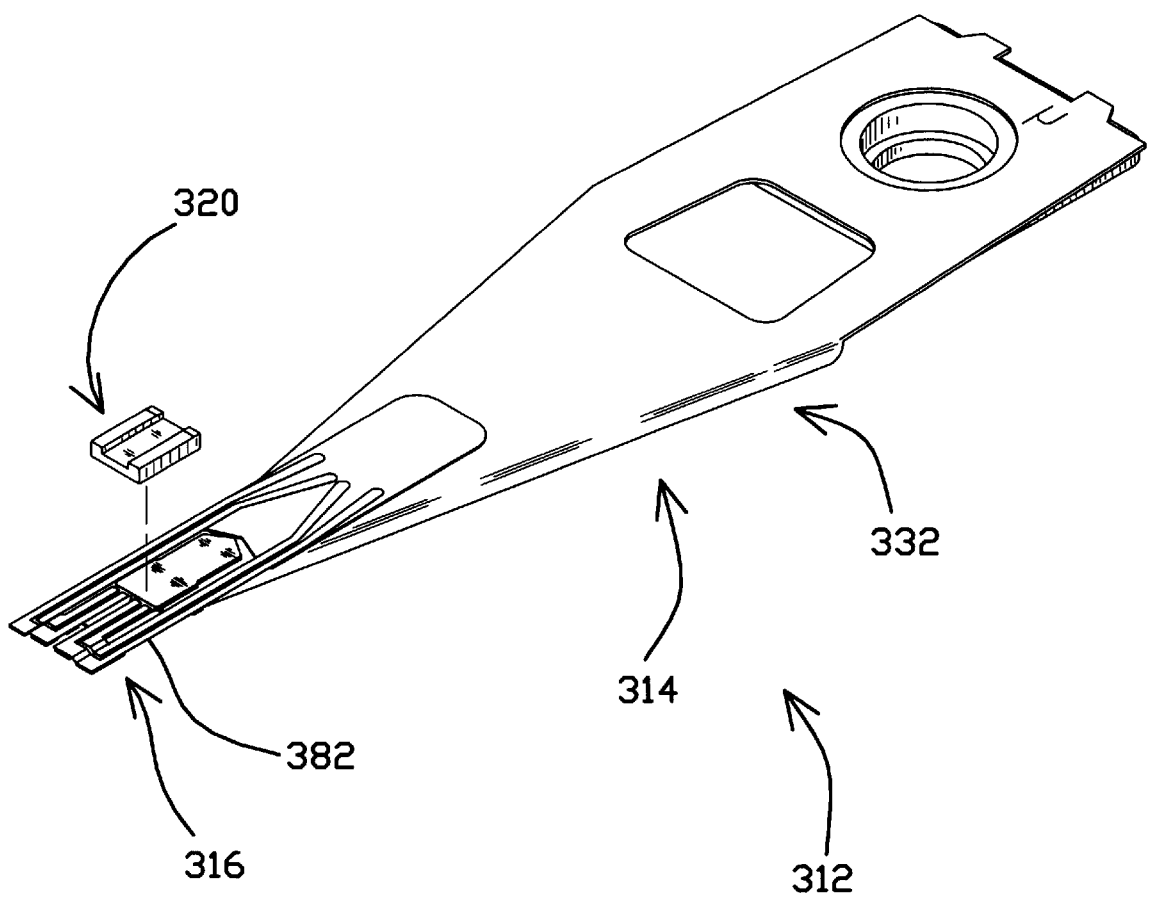
FIG. 12 is a perspective view of a fourth embodiment of a head suspension assembly including a three-layer gimbal-interconnect assembly in accordance with the present invention.

FIG. 12 shows a HSA 312 including a load beam 332 and a new laminate structure, a gimbal-interconnect assembly 316 attached to the load beam 332. Only the gimbal-interconnect assembly 316 is a laminate structure.

The different laminate layers of the gimbal-interconnect assembly 316 are better seen in the exploded view of FIG.

13. The gimbal-interconnect assembly 316 includes a first stainless steel layer 350, a second intermediate insulation layer 390, and a third BeCu layer 370.

The first layer 350 is attached to one side of the second layer 390 and comprises a load beam plate 352, a flexure tongue plate 364, and a plurality of support islands 351 adjacent to the flexure tongue plate 364. Support islands 351 are small, usually rectangular, plates of stainless steel that give support and lateral stiffness to otherwise unsupported spans of traces 371, specially during offset forming.

During offset forming a slope region 384 is created on the spring arms 382 of the traces 371. The first layer 350 and the second layer 390 are removed along the slope region 384. The slope region 384 is angled away from the surface of the load beam 332, resulting in added clearance from the longitudinal side portions of the spring arms 382 of the traces 371 during movement of the head assembly 320. The islands 351 are placed at the ends of the slope region 384 and provide a flat support surface for punch shaping processes during offset forming. During punch shaping, the traces 371 are bent with a punch press. Because the punch shaping process may bend corners (especially the inside corners) of the slope region 384 of the traces 371 over the stainless steel islands 351, the islands 351 are electrically isolated from each other to prevent electrical short circuits.

The third layer 370 is attached to the other side of the second layer 390 and comprises a flexure bond pad 386, two pairs of generally parallel traces 371 that extend on the outside of the gimbal-interconnect assembly 316. The bond pad 386 can be etched at full thickness, thus leaving a raised surface that matches the raised slope 384 achieved by offset forming. The traces 371 include a proximal end 373, a distal end 374, and a gimbal region 380. The gimbal region 380 has a portion shaped as gimbal spring arms 382. The traces 371 act as a link between the load beam plate 352, the flexure tongue plate 364, and the islands 351 of the first layer 350. The spring arms 382 first extend longitudinally past the load beam plate 352 of the first layer 350 and alongside the flexure tongue 364. The arms 382 then describe two adjacent inside "U" loops to place the distal ends 374 of the traces 371 next to electrical terminals 323 of head assembly 320.

The second layer 390 comprises a plurality of intermediate insulating panels 392 and 393 separating, but also bonding, all overlapping areas between the first layer 350 and the third layer 370.

The method of manufacture of the HSA 312 including gimbal-interconnect assembly 316 is similar to that of other laminate structures in the present invention. A three-layer laminate plate such as that of FIG. 3 is provided. First, the metal layers 350 and 370 are etched into the desired shapes, exposing areas of the second layer 390. In multi-element designs such as the present gimbal-interconnect 316, the second layer 390 not only acts as an etching stop, but also acts as a support sheet to hold together all the separate elements during manufacture. Second, the second layer 390 is etched. Removal of the exposed areas of the second layer 390 allows gimbal 340 to flex freely and reduces the mass and stiffness of the gimbal-interconnect assembly 316. The metal layers 350 and 370, with their superior mechanical characteristics, act as the principal spring elements. Third, the finished gimbal-interconnect assembly 316 is attached to load beam 332 using a weld point or other methods known in the art. The load beam 332 includes a load button 397 adjacent the distal end that is aligned with the tongue plate 364 and with the bond pad 386. Fourth, the head assembly 320 and the gimbal-interconnect assembly 316 are mechanically coupled, using conductive epoxy or other methods known in the art, and electrically coupled using connector means, such as those shown in FIGS. 21–23. Conventional lead wires or other conductive traces (not shown) can couple the traces 371 to amplifying and control electronics (not shown). The order of steps three and four can be reversed.

Figure 14:
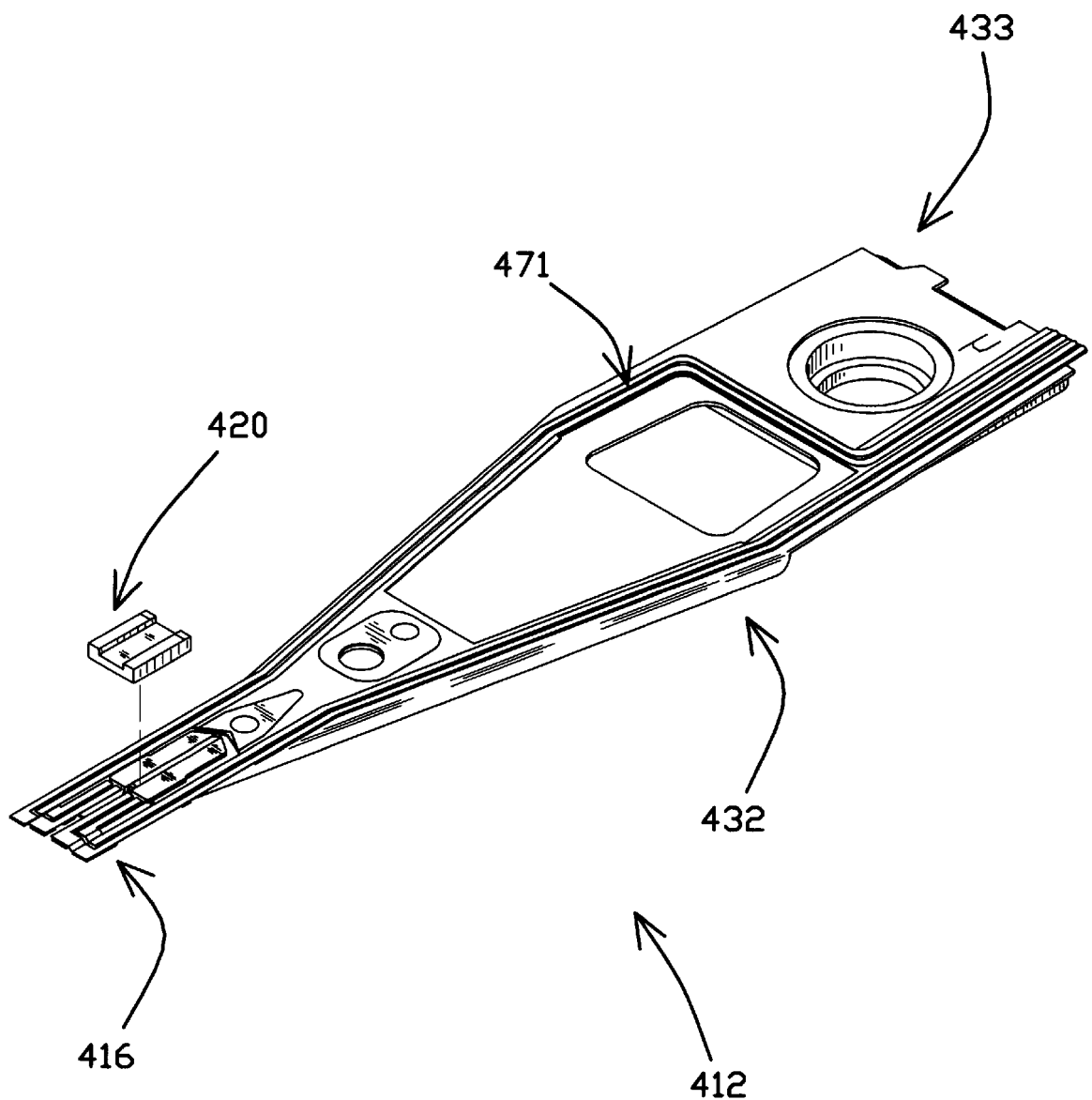
FIG. 14 is a perspective view of a fifth head suspension assembly including another embodiment of a three-layer gimbal-interconnect assembly.
Figure 15:
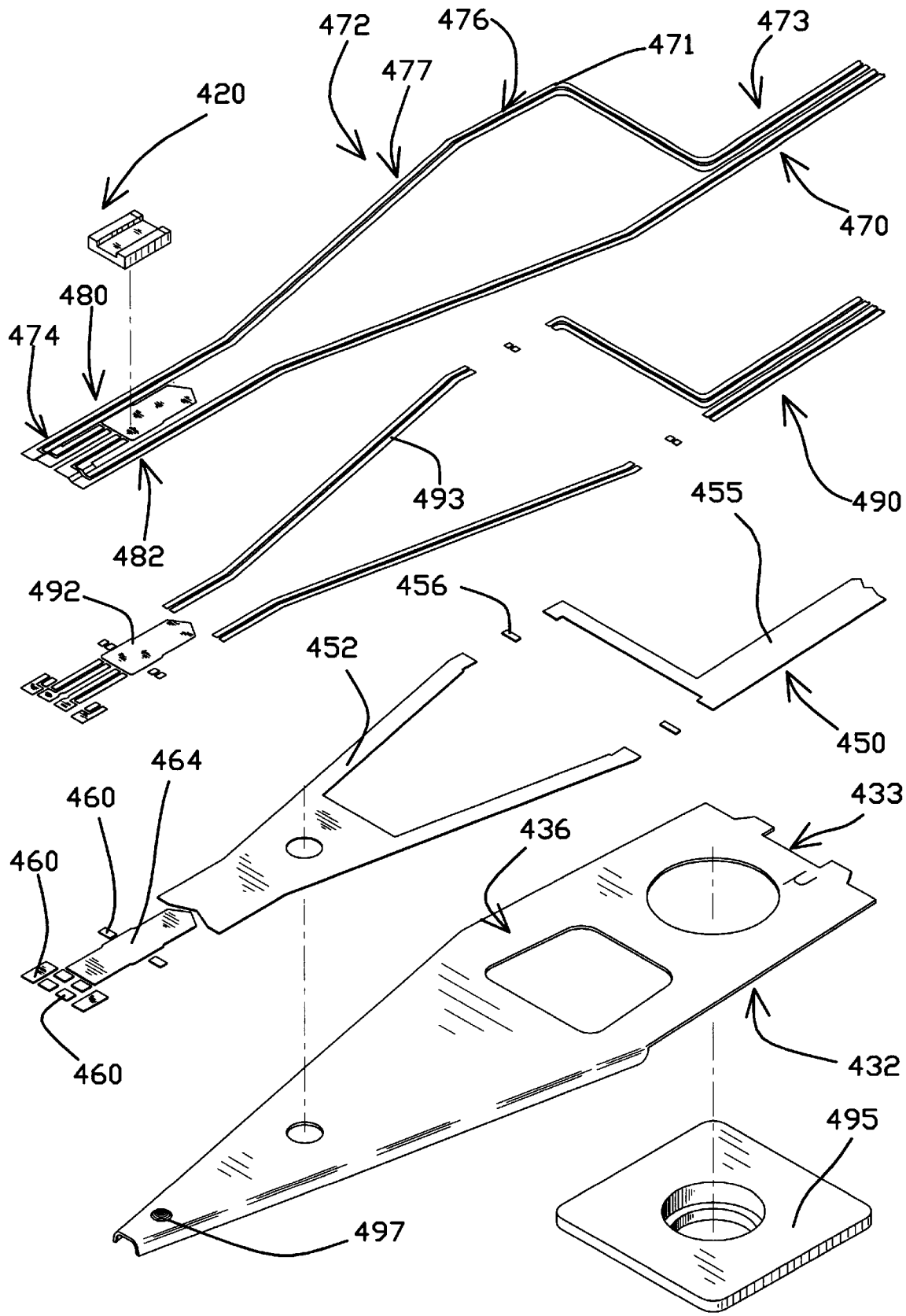
FIG. 15 is an exploded perspective view of the head suspension assembly of FIG. 14.

HSA 412 shown in FIGS. 14 and 15, closely resembles HSA 312 of FIG. 12. The main difference is that gimbal-interconnect assembly 416 includes traces 471 that extend the length of load beam 432 and past the proximal end 433 of the load beam 432. The third layer 470 has four traces 471 split into two independent pairs. Traces 471 include a proximal end 473, a distal end 474 load beam region 472, a spring region 476, a rigid region 477, and a gimbal region 480. The stainless steel layer 450 acts as a support structure and comprises a load beam panel 452, a base panel 455, two spring region islands 456, a tongue panel 464, and eight gimbal arm islands 460. The stainless steel layer 450 is removed along most of the path of gimbal spring arms 482 and over most of the spring region 436 of the load beam 432 to reduce stiffness. The stainless steel islands 456 and 460 support the traces 471 across open gaps and during offset forming. Gimbal arm islands 460 provide clamping locations used to hold the spring arm 482 flat while the offset is formed. The islands 460 and 456 also help with lateral stiffness, a performance characteristic needed on good suspension designs.

Figure 13:
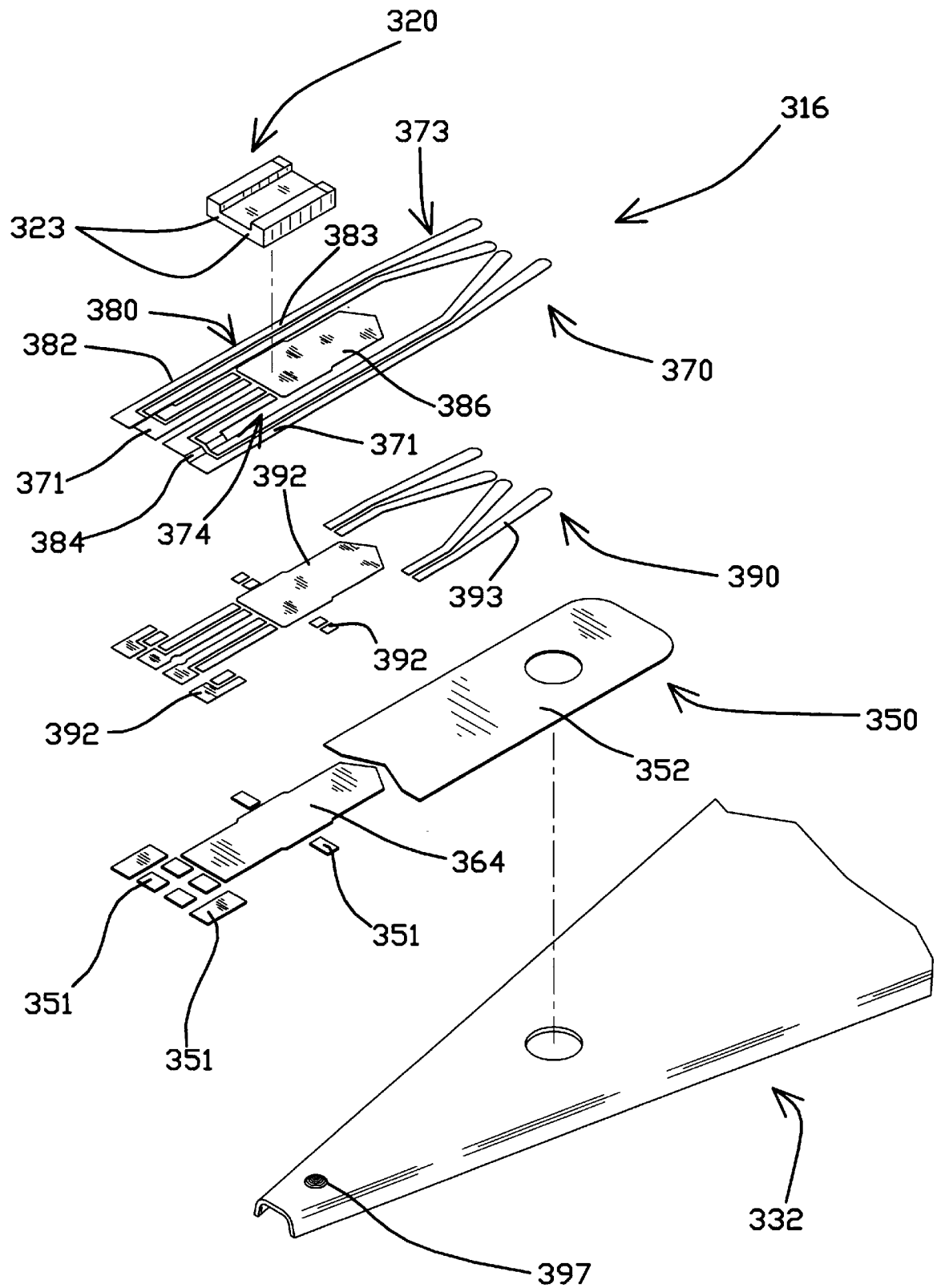
FIG. 13 is an exploded perspective view of a distal end portion of the head suspension assembly shown in FIG. 12.
Figure 16:
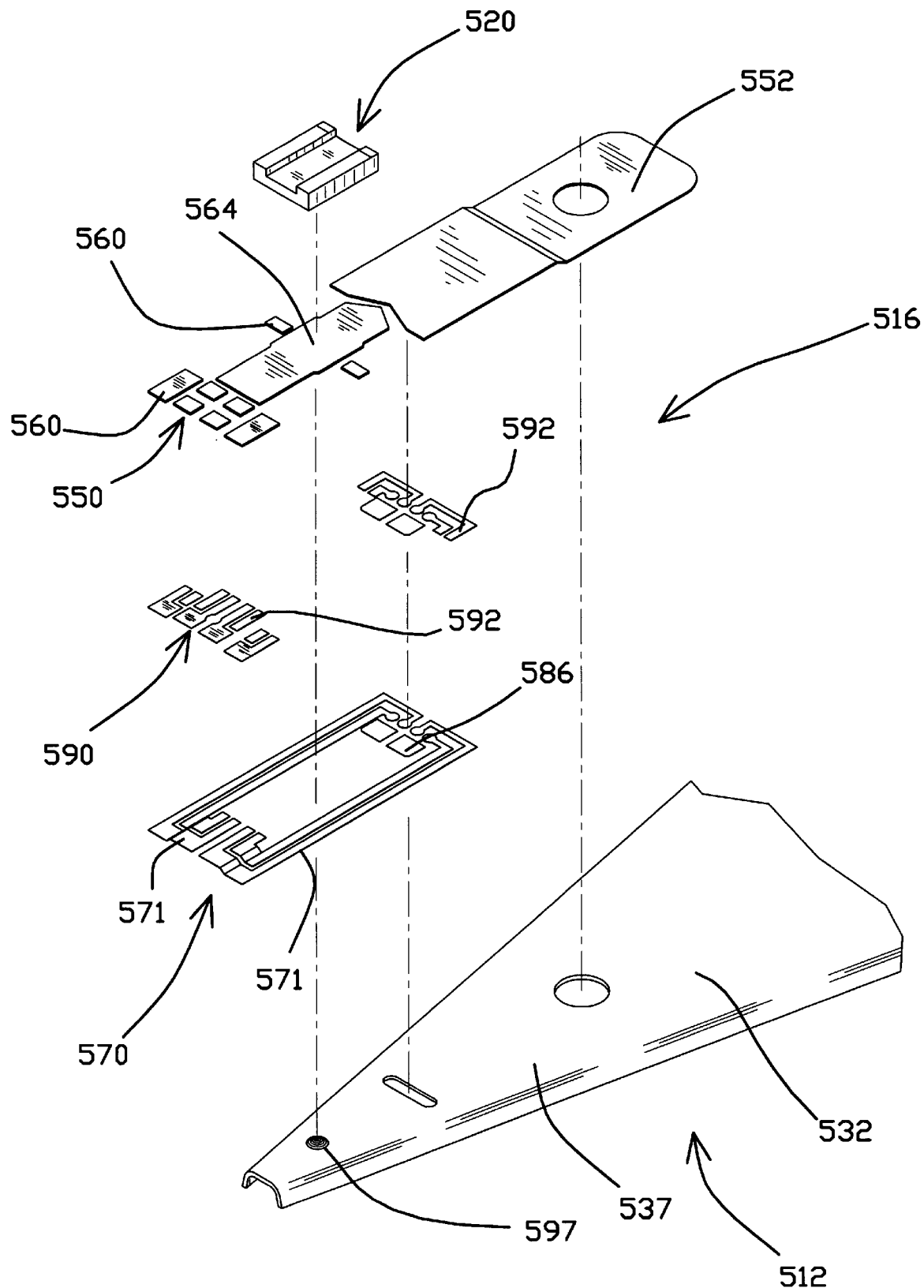
FIG. 16 is an exploded perspective view of a distal end portion of a sixth embodiment of a head suspension assembly including another embodiment of a three-layer gimbal-interconnect assembly wherein the order of the layer is reversed.

FIG. 16 shows a distal end portion of a sixth embodiment of an HSA 512 including a gimbal-interconnect assembly 516 attaching to a rigid region 537 of a load beam 532. Gimbal-interconnect 516 is a laminate structure wherein the order of the layers with respect to the load beam 532 is reversed when compared to the embodiment of FIGS. 12 and 13. The first layer 550 includes a load beam stiffening plate 552, a tongue plate 564, and gimbal islands 560. The second layer 590 includes a plurality of insulation panels 592. The third layer 570 includes four traces 571 acting as spring arms and two bond pads 586. A distal portion of the traces 571 extends past the distal end of the load beam 532. The second layer panels 592 attach the third layer elements to the tongue plate 564 of the first layer 550. The load beam plate 552 attaches to the load beam 532, by welding or other methods known in the art.

Figure 17:
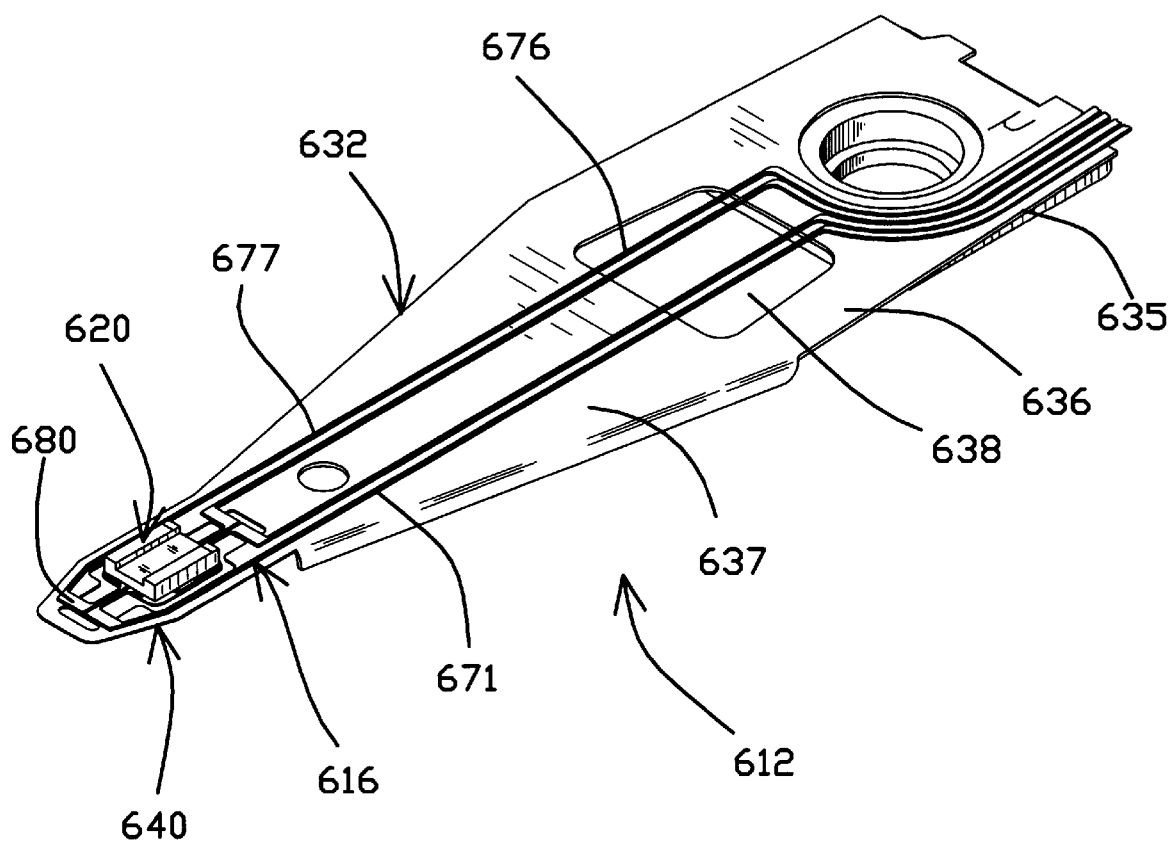
FIG. 17 is a perspective view of a seventh embodiment of an HSA in accordance with the present invention wherein the traces extend over the spring aperture of the load beam.

Conductors can affect the flexibility of the spring region of the load beam. A third power increase in stiffness results from increasing the thickness of the spring region by manufacturing overlapping layers. FIG. 17 shows an HSA 612 including a head assembly 620, a gimbal-interconnect assembly 616, and a load beam 632. The load beam 632 includes a base region 635, a spring region 636, a rigid region 637, and gimbal region 640. Spring region 636 includes spring aperture 638 used to tailor the spring stiffness of the spring region 636 according to the required load characteristics of the head assembly 620. The gimbal-interconnect assembly includes traces 671. Traces 671 include a spring region 676, a rigid region 677, and a gimbal region 680.

The design of HSA 612 avoids triple-layer thickness over the spring region 636 of the load beam 632 by taking advantage of the resiliency of traces 671 and extending the spring region 676 of the traces 671 across spring aperture 638. All stainless steel material and all insulating material is removed from under the spring region 676. Since the traces 671 do not overlap the spring region of load beam plate, spring region 636 is only one layer thick. Since the stiffness of the spring region 636 is directly proportional to the third power of its thickness, a one layer spring region 636 has a stiffness several times lower than a three or two layer spring region.

Figure 18:
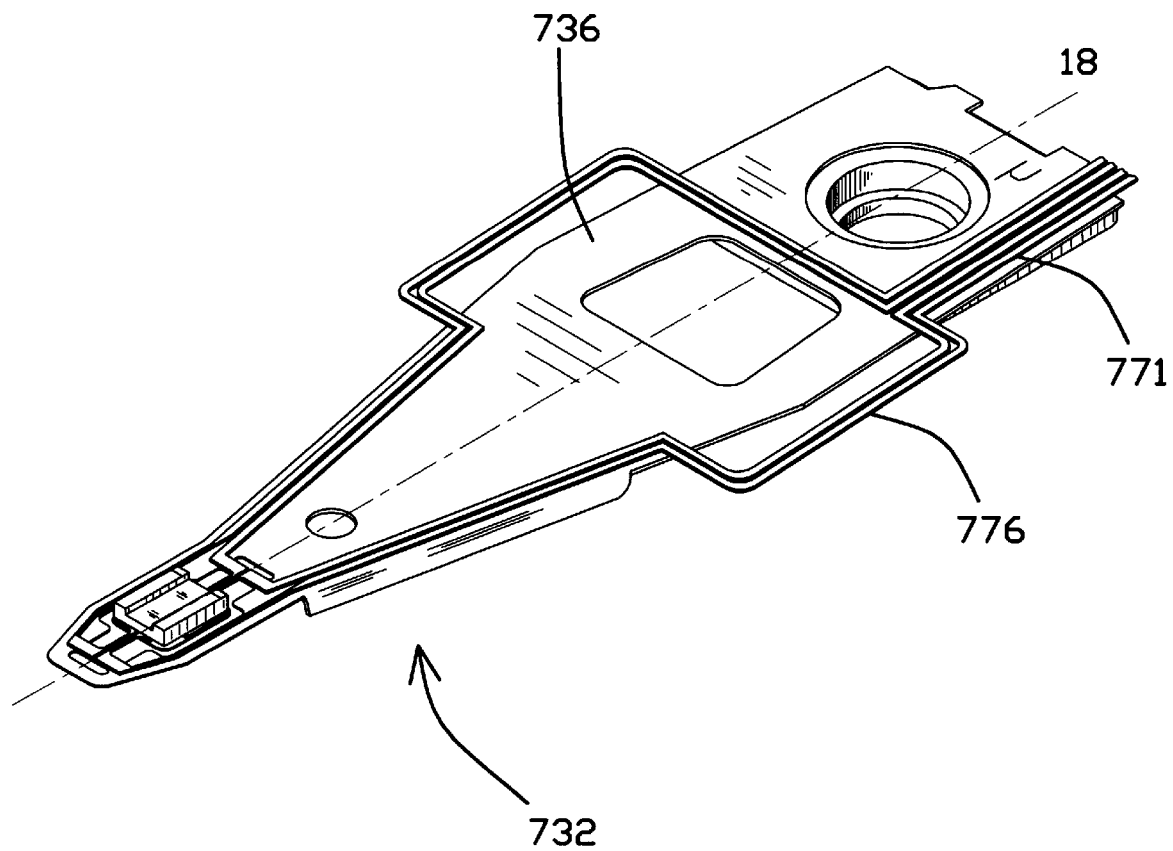
FIG. 18 is a perspective view of an eighth embodiment of an HSA in accordance with the present invention wherein the traces extend alongside the spring region of the load beam.

FIG. 18 shows another variation of the one-layer concept, in which spring regions 776 of traces 771 are configured to extend in parallel paths to the longitudinal axis 18 alongside spring region 736 of the load beam 732. In both the embodiment of FIG. 17 and in the present embodiment of FIG. 18, the spring regions 676 and 776 of traces 671 and 771 can be routed in an angle with respect to the longitudinal axis 18, to further reduce the stiffening vector and increase the length of the spring regions 676 and 776.

Figure 19:
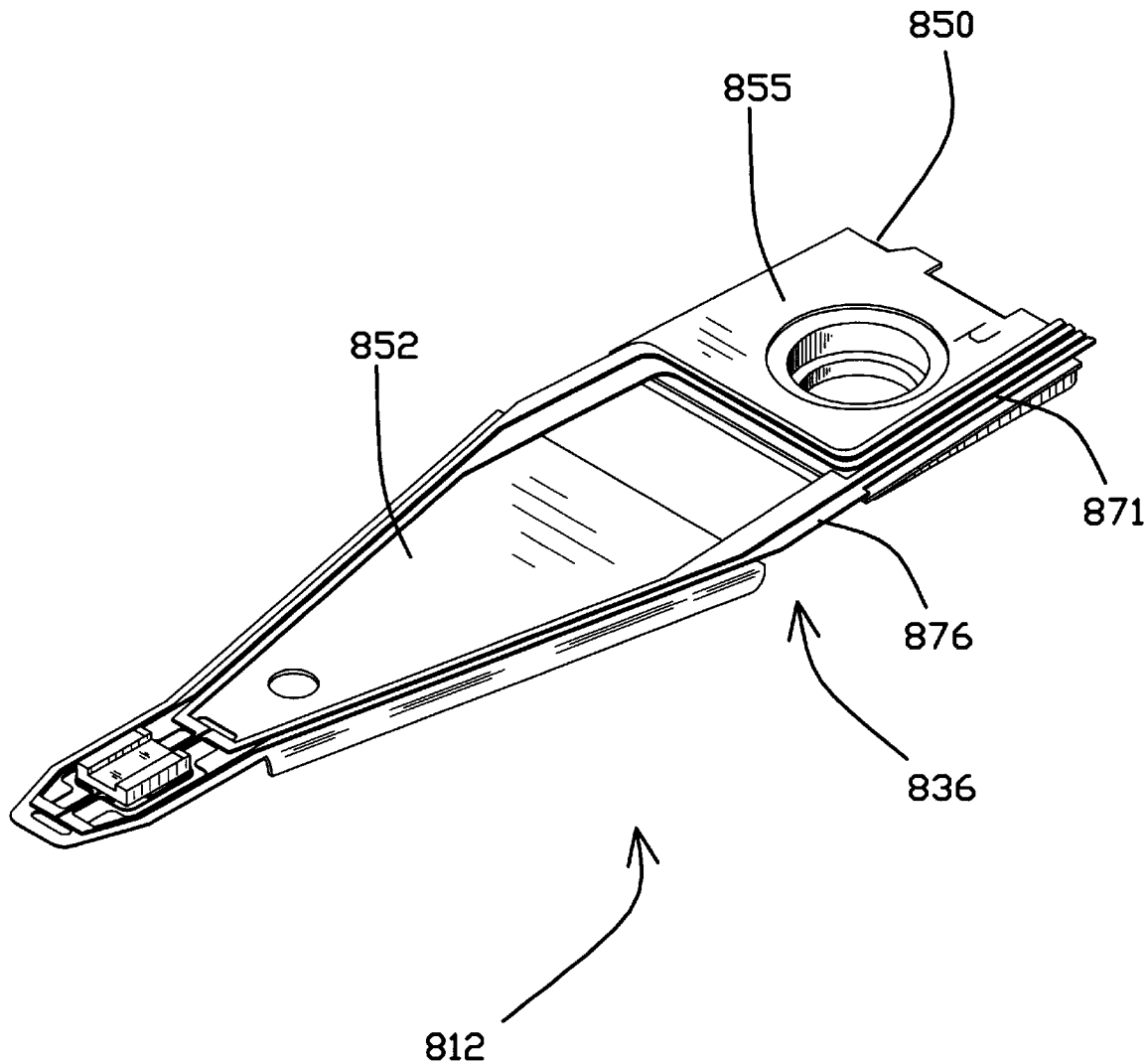
FIG. 19 is a perspective view of a ninth embodiment of an HSA in accordance with the present invention wherein the traces act as the spring elements of the spring region.

Not only can the interconnect assembly act as a gimbal (eliminating the effect of conductor added stiffness in the gimbal), but it can also replace the spring region of the load beam (.thereby also eliminating conductor added stiffness in the spring region). FIG. 19 shows a ninth embodiment of an HSA 812 having traces 871 that widen at spring regions 876 to provide all the spring material for spring region 836. All stainless steel and all insulator material are removed from spring region 836. The first layer 850 comprises two separate plates, a load beam plate 852 and a base plate 855.

Figure 20:
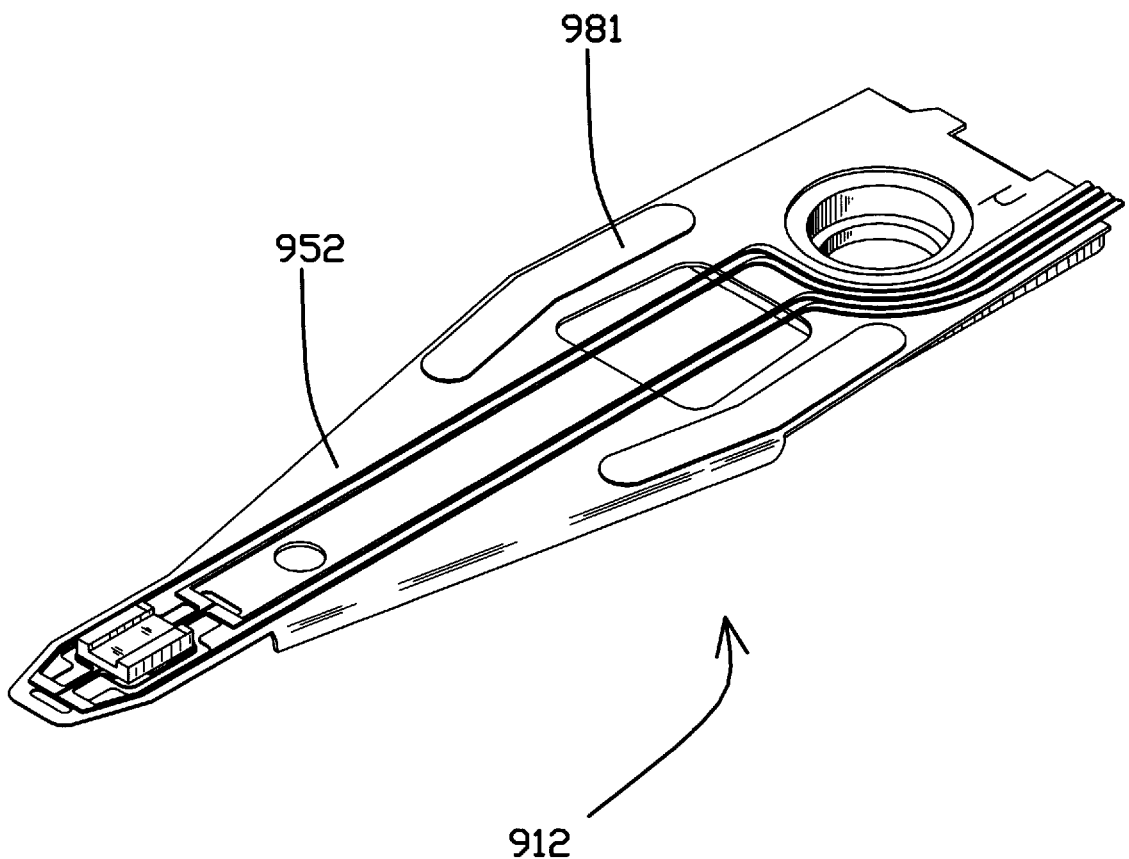
FIG. 20 is a perspective view of a tenth embodiment of an HSA in accordance with the present invention including spring support plates.

In some HSA embodiments that use very thin materials, such as HSA 912 shown in FIG. 20, an increase in strength across the spring region is desired to prevent metal yielding. HSA 912 includes spring region stiffening plates 981. Stiffening plates 981 comprise third layer material attached to load beam plate 952 by second layer adhesive material. The stiffening plates 981 extend from base region 935, over the sides of the spring region 936, and into a portion of rigid region 937. In other embodiments (not shown), the stiffness of any region of the load beam plate 952 can be tailored by adding stiffening pads of matching geometries.

FIG. 21 shows an enlarged detail view of an embodiment of a connector means from the electrical terminals 423 of head assembly 420 to the traces 471 of the gimbal-interconnect assembly 416 of FIG. 14. Connecting loops 448 of fine wire are first bonded to each electrical terminal 423 before the head assembly 420 is attached to the gimbal-interconnect assembly 416. The wire bonding can be done with conventional ultrasonic bonding equipment, since the two bond points 424 and 425 rest on the same plane. Once the head assembly 420 is attached to the gimbal-interconnect assembly 416, the connecting loops 448 are pushed down and electrically connected to the corresponding traces 471 using methods known in the art such as wire bonding, soldering, or attachment by a conductive adhesive. Optionally, the connecting loops 448 can be twisted to lay horizontally on the traces 471 to provide a wider contact surface. The advantages of the connecting loops 448 are flexibility, redundant two-point (424 and 425) connections to the head terminals 423, and ease of manufacture.

FIG. 22 shows another method for connecting the traces 471 to the electrical terminals 423 of head 420. "L" shaped contacts 449 extend from the side mounted electrical terminals 423 to the top of slider 421. The traces 471 then bond directly onto the contacts 449. The traces 471 can also couple electrically and mechanically to the top of the slider 421 when using head assemblies with top-mounted electrical terminals (not shown).

FIG. 23 shows yet another method for connecting the traces 471 to the electrical terminals 423. Droplets 429 of conductive epoxy form an elastic electrical bond between the traces 471 and the electrical terminals 423. The droplets 429 are applied in a viscous state and solidify after a cure cycle.

Figure 24:
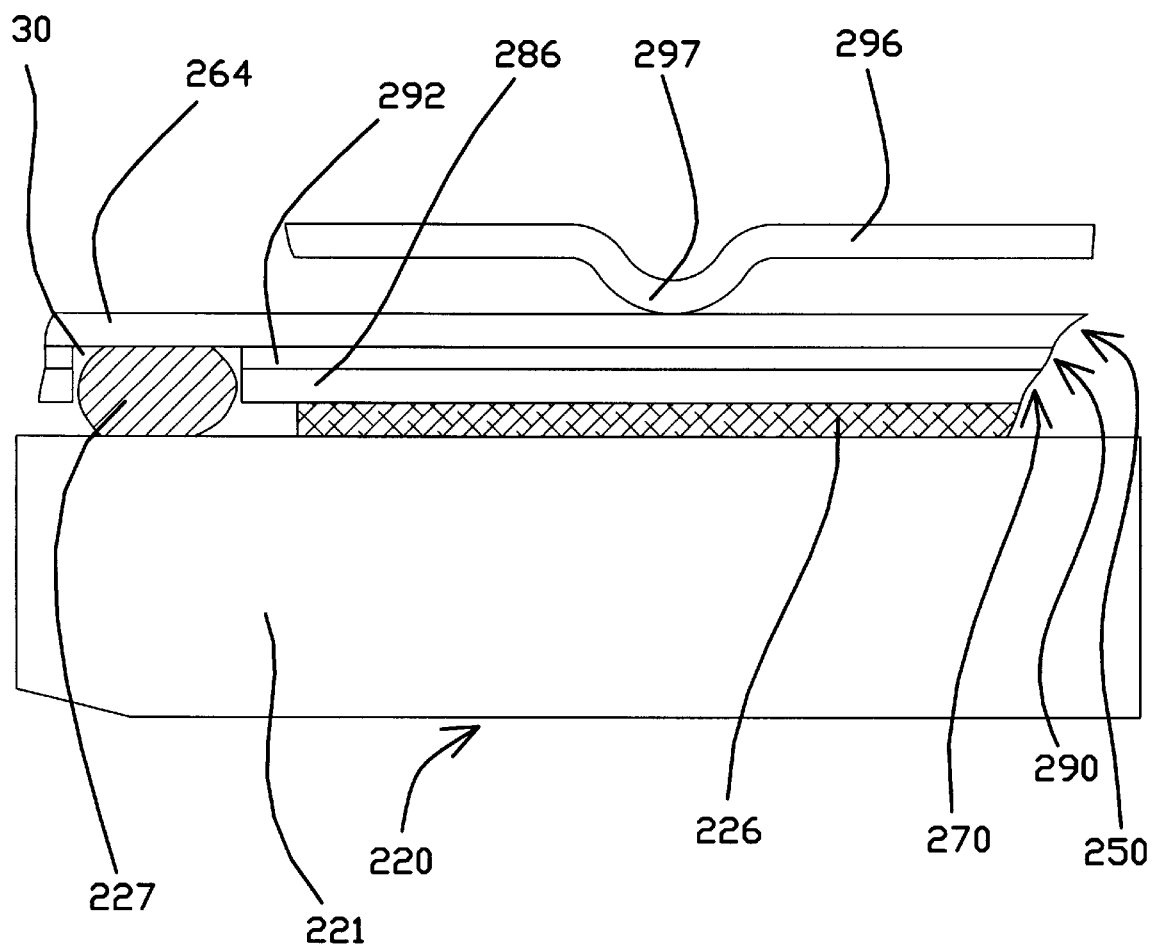
FIG. 24 is a side view of a cross-sectional cut along the longitudinal axis of a head assembly attaching to the suspension assembly of FIGS. 10 and 11 wherein the slider is electrically coupled to the first layer by a dot of conductive epoxy.
Figure 25:
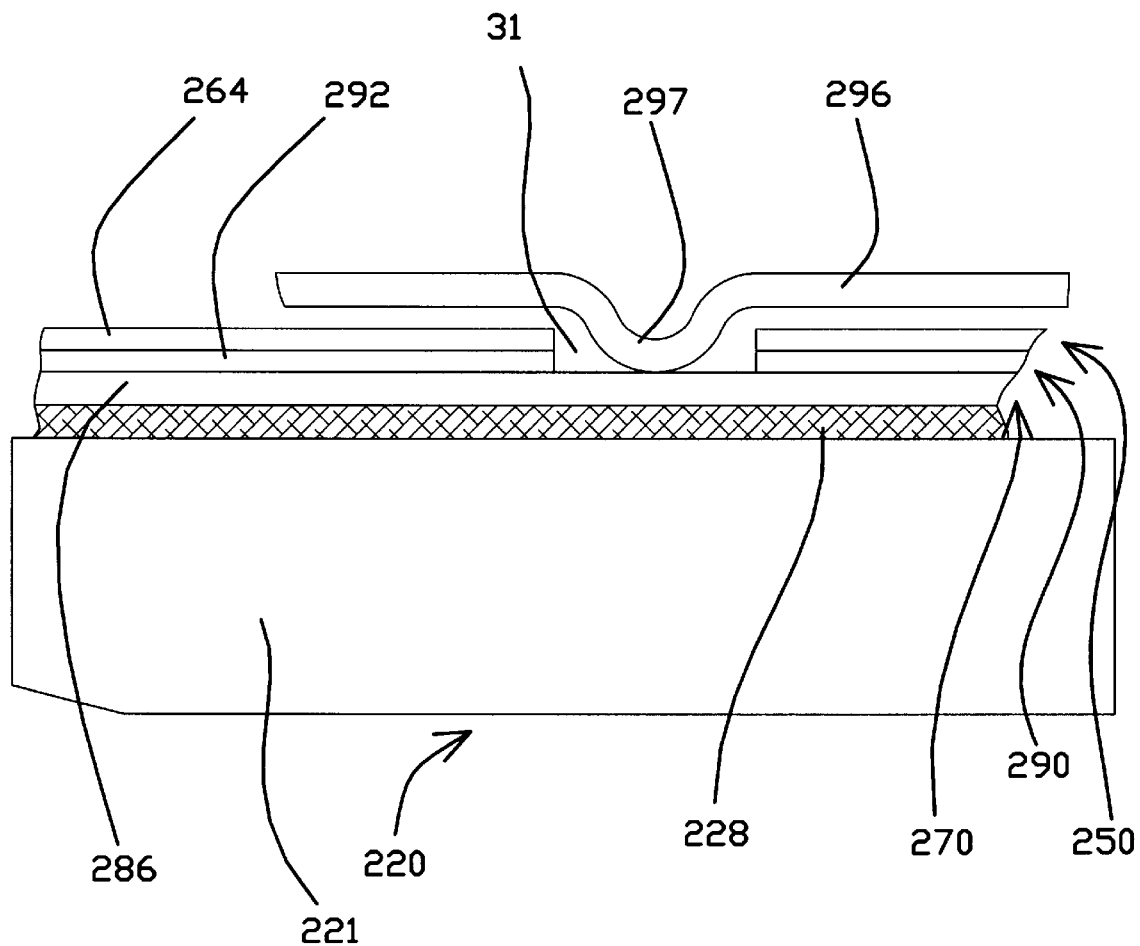
FIG. 25 is a side view of a cross-sectional cut along the longitudinal axis of the head assembly attaching to the suspension assembly of FIGS. 10 and 11 wherein the first layer and the second layer are etched so that a bond pad in the third layer is electrically coupled to the load button of the load button cover.

FIGS. 24 and 25 show different methods for allowing static electricity bleed-off from head assembly 220 of FIG. 10. HSAs generally use the suspension assembly as an electrical ground. But since the gimbal-interconnect assembly 216 and the suspended head assembly 220 are electrically isolated from the suspension assembly 214, the head assembly 220 can buildup an electrostatic charge that can discharge through the transducer to the disk surface or to the traces 271, affecting data or damaging the head assembly 220. In FIG. 24, a contact cavity 30 is etched on the bond pad 286 and on the intermediate insulation panel 292. Contact cavity 30 allows the top of the slider 221 to be connected to the tongue plate 264 of the stainless steel layer 250 by a drop of conductive epoxy 227. In other embodiments (not shown), the drop 227 can be replaced by other conductive means such as small conductors, solder, or other means known in the art. The load button 297 contacts the tongue plate 264 and grounds the slider 221 to the load beam plate 252. Epoxy layer 226 bonds the slider 21 to the bond pad 286.

In FIG. 25, contact cavity 31 is etched on the tongue plate 264 and the underlying matching insulation/adhesion panel 292 to allow contact between the load button 297 and the surface of the bond pad 286 (which is electrically isolated from traces 271). A layer of conductive epoxy 228 connects the bond pad 286 to the top of the slider 221. Other embodiments (not shown) ground the slider 221 using an additional trace connected at one end to the slider 221 and at the other end to a suitable ground such as load beam 232, the actuator arm, or the frame of the disk drive.

There are many advantages to the present designs, both during operation and manufacture. First, BeCu traces offer important advantages. Due to the use of BeCu, the present laminate structures have better mechanical characteristics than traditional wire interconnect and suspension assembly combinations. The use of the interconnect as the gimbal or as the spring dramatically reduces the stiffness of the delicate gimbal or spring region. The high-tensile, high-yield strength BeCu approximately matches the strength and thermal coefficient of expansion of the stainless steel used to define the load beam. A high strength spring material that closely matches the spring characteristics of stainless-steel under load greatly reduces the chance of subjecting the gimbal assembly to adverse shifts in the static attitude. Low strength, non-spring materials can easily yield during adverse handling and assembly operations, imparting unknown stresses to the suspension assembly, which invariably lead to shifts in the nominal static attitude of the gimbal flexure.

The resiliency of the third layer allows pre-shaping of the interconnect assembly in any design. Wire handling and wire service loops are eliminated and consistent conductor paths without loads or biases are achieved every time.

Second, the laminate gimbal-interconnect assemblies include the novel "island concept" wherein bifurcated spring arms are supported by small stainless steel islands. The islands dramatically increase the lateral stiffness of the gimbal, while leaving pitch and roll stiffness relatively low. The islands also act as support structures for punch shaping processes during offset forming.

Third, the use of laminate structures allows the processing of materials that are thinner and more delicate than those normally capable of being processed. The second layer supports the metal layers through the etching process, resulting in higher yields even with fragile geometries. In addition, the laminate structure allows the replacement of some partial etching with "as rolled" material by laminating layers to a desired thickness. The suspension assembly can have single layers in the spring region or gimbal regions to lower stiffness and provide clearance. Differential material thicknesses are possible by combining the composite materials and partial etching processes. Low vertical profiles are ideal for newer, "compact" disk drives with small disk-to-disk spacing.

Fourth, laminate structures have unique manufacturing advantages due to their middle second layer. The second layer provides a built-in etch stop for the chemical etching of the metal layers. The intervening second layer allows a different geometry on each metal layer (the second layer is a hard stop for the metal etchant). Unique configurations are possible where either or both metal layers can be discontinuous, consisting of separate and unconnected individual plates, thanks to the manufacturing support of the second layer. The second layer also acts as an insulator during the plating process. If some of the second layer is plasma etched away prior to plating, either metal layer can be selectively plated.

Fifth, although the second layer is used as a support element during manufacture, during operation only the better suited first and third layers act as spring elements. The second layer is etched away, freeing the metal spring structures and eliminating the concerns of dimensional stability and unnecessary mass and stiffness found in other laminate structures.

Sixth, the laminate gimbal-interconnect assembly has better electrical characteristics than the prior art. The width and thickness of the traces can vary to change the resistance or the capacitance of the conductor along its path. There is no impedance fluctuation caused by loose wires. Traces provide improved electrical signal performance in high frequency operations.

The invention is not to be taken as limited to all of the details thereof as modifications and variations thereof may be made without departing from the spirit or scope of the invention.

What is claimed is:

1. An integrated lead disk drive suspension, including:
   a load beam having proximal and distal ends, a base region on the proximal end, a rigid region between the proximal and distal ends, a head bonding platform on the distal end, and one or more spring regions connecting the head bonding platform to the base region; and
   one or more conductive traces integrated with and insulated from the load beam by an adhesive dielectric layer, the traces and dielectric layer extending between the head bonding platform and the base region and including one or more compensating portions each of which extends off the load beam and traverses a nonlinear path around at least a portion of one or more of the spring regions to reduce mechanical effects of the conductive traces and dielectric layer on spring characteristics of the spring regions.

2. The integrated lead suspension of claim 1 wherein the one or more spring regions include a spring region connecting the rigid region of the load beam to the base region.

3. The integrated lead suspension of claim 2 wherein the one or more compensating portions include a compensating portion traversing a nonlinear path of at least about 90° around the one or more spring regions.

4. The integrated lead suspension of claim 2 wherein the one or more compensating portions include a compensating portion traversing a nonlinear path of at least about 180° around the one or more spring regions.

5. The integrated lead suspension of claim 1 wherein the one or more compensating portions include a compensating portion traversing a nonlinear path of at least about 90° around the one or more spring regions.

6. The integrated lead suspension of claim 1 wherein the one or more compensating portions include a compensating portion traversing a nonlinear path of at least about 180° around the one or more spring regions.

7. An integrated lead disk drive suspension, including:
   a load beam having proximal and distal ends and a base region on the proximal end;
   a flexure including a spring region and a head bonding platform on the distal end of the load beam; and
   one or more conductive traces integrated with and insulated from the flexure and load beam by an adhesive dielectric layer, the traces and adhesive dielectric layer extending between the head bonding platform and the base region, and wherein portions of the conductive traces extending between the distal end of the load beam and the head bonding platform at the flexure are substantially free from the adhesive dielectric layer to reduce mechanical effects of the dielectric on spring characteristics of the flexure.

8. An integrated lead disk drive suspension, including:
   a load beam having proximal and distal ends and a base region on the proximal end;
   a flexure having a head bonding platform on the distal end of the load beam; and
   one or more conductive traces integrated with and insulated from the flexure and/or load beam by an adhesive dielectric layer, the traces and adhesive dielectric layer extending between the head bonding platform and the base region, the traces and adhesive dielectric layer each having a width, wherein the width of portions of the dielectric layer is about equal to or less than the width of adjacent portions of the conductive traces.

9. The integrated lead disk drive suspension of claim 8 wherein the suspension includes at least two conductive traces insulated from the flexure and load beam by the adhesive dielectric layer, and wherein the conductive traces and adhesive dielectric layer are parallel to and spaced-apart from one another.

* * * * *